United States Patent
Qian et al.

(10) Patent No.: US 6,872,467 B2
(45) Date of Patent: Mar. 29, 2005

(54) MAGNETIC FIELD SENSOR WITH AUGMENTED MAGNETORESISTIVE SENSING LAYER

(75) Inventors: Zhenghong Qian, Eden Prairie, MN (US); James M. Daughton, Eden Prairie, MN (US); Dexin Wang, Eden Prairie, MN (US); Mark C. Tondra, Minneapolis, MN (US)

(73) Assignee: NVE Corporation, Eden Prairie, MN (US)

( * ) Notice: Subject to any disclaimer, the term of this patent is extended or adjusted under 35 U.S.C. 154(b) by 0 days.

(21) Appl. No.: 10/704,870

(22) Filed: Nov. 10, 2003

(65) Prior Publication Data

US 2004/0115478 A1 Jun. 17, 2004

Related U.S. Application Data

(60) Provisional application No. 60/425,459, filed on Nov. 12, 2002.

(51) Int. Cl.[7] .................................................. G11B 5/39
(52) U.S. Cl. ........................ 428/611; 428/637; 428/660; 428/686; 428/213; 428/692; 360/324.12; 360/324.2
(58) Field of Search ................................. 428/611, 637, 428/660, 686, 213, 692; 360/324.12, 324.2

(56) References Cited

U.S. PATENT DOCUMENTS

| 5,508,867 | A | | 4/1996 | Cain et al. |
| 6,090,498 | A | * | 7/2000 | Omata et al. ............... 428/692 |
| 6,127,053 | A | * | 10/2000 | Lin et al. .................... 428/692 |
| 6,153,320 | A | * | 11/2000 | Parkin ........................ 428/693 |
| 6,462,919 | B1 | * | 10/2002 | Mack et al. ............. 360/327.3 |
| 6,466,419 | B1 | * | 10/2002 | Mao ...................... 360/324.12 |
| 6,556,392 | B1 | * | 4/2003 | Mao et al. ............. 360/324.12 |
| 2002/0044398 | A1 | * | 4/2002 | Sasaki et al. .......... 360/324.12 |
| 2002/0048690 | A1 | * | 4/2002 | Fukuzawa et al. .......... 428/692 |

* cited by examiner

Primary Examiner—Kevin M. Bernatz
(74) Attorney, Agent, or Firm—Kinney & Lange, P.A.

(57) ABSTRACT

A ferromagnetic thin-film based magnetic field sensor having a nonmagnetic intermediate layer with two major surfaces on opposite sides thereof upon one of which a magnetization reference layer is provided and upon the other there being provided a sensing layer. A spacer layer is provided on the sensing film to separate this sensing film from an augmenting film with the spacer layer being sufficiently thick so as to significantly reduce or eliminate topological coupling between the sensing and augmenting films, and to significantly randomize spin states of emerging electrons traversing therethrough.

34 Claims, 16 Drawing Sheets

MAGNETIC FIELD SENSOR WITH AUGMENTED MAGNETORESISTIVE SENSING LAYER

CROSS-REFERENCE TO RELATED APPLICATION

This application claims the benefit of Provisional Application No. 60/425,459 filed on Nov. 12, 2002 entitled "MAGNETIC FIELD SENSOR WITH AUGMENTED MAGNETORESISTIVE SENSING LAYER".

BACKGROUND OF THE INVENTION

The present invention relates to low hysteresis exchange biased spin-valve and spin dependent tunneling magnetic field sensors.

Many kinds of electronic systems make use of magnetic material based devices. Digital memories are used extensively in digital systems of many kinds including computers and computer systems components, and digital signal processing systems. Such memories can be advantageously based on the storage of digital bits as alternative states of magnetization in magnetic materials in each memory cell, particularly in cells using thin-film magnetic materials, resulting in memories which use less electrical power and do not lose information upon removals of such electrical power.

Magnetometers and other magnetic sensing devices are also used extensively in many kinds of systems including magnetic disk memories and magnetic tape storage systems of various kinds. Such devices provide output signals representing the magnetic fields sensed thereby in a variety of situations.

Such memory cells and sensors can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

In the recent past, reducing the thicknesses of the ferromagnetic thin-films and the intermediate layers in extended "sandwich" structures in which the two major surfaces of the intermediate layer each have thereon an anisotropic ferromagnetic thin-film layer, including those having additional alternating ones of such films and layers, i.e. superlattices, have been shown to lead to a "giant magnetoresistive effect" being present. This effect yields a magnetoresistive response which can be in the range of an order of magnitude or more greater than that due to the well-known anisotropic magnetoresistive response.

In the ordinary anisotropic magnetoresistive response, varying differences between the direction of the magnetization vector in the ferromagnetic film and the direction of the sensing current passed through the film lead to varying differences in the effective electrical resistance in the direction of the current. The maximum electrical resistance occurs when the magnetization vector in the film and the current direction are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance follows a square of the cosine of that angle.

As a result, operating external magnetic fields can be used to vary the angle of the magnetization vector in such a film portion with respect to the easy axis of that film portion. Such an easy axis comes about because of an anisotropy in the film typically resulting from depositing that film in the presence of a fabrication external magnetic field oriented in the plane of the film along the direction desired for the easy axis in the resulting film. During subsequent operation of the device with the resulting film, such operating external magnetic fields can vary the angle to such an extent as to cause switching of the film magnetization vector between two stable states which occur as magnetizations oriented in opposite directions along that easy axis. The state of the magnetization vector in such a film portion can be measured, or sensed, by the change in resistance encountered by current directed through this film portion. This arrangement has provided the basis for a ferromagnetic, magnetoresistive anisotropic thin-film to serve as part of a memory cell and to serve as part of a magnetic field sensor.

In contrast to this arrangement, the resistance in the plane of a ferromagnetic thin-film is isotropic with respect to the giant magnetoresistive effect rather than depending on the direction of a sensing current therethrough as for the anisotropic magnetoresistive effect. The giant magnetoresistive effect has a magnetization dependent component of resistance that varies as the cosine of the angle between magnetizations in the two ferromagnetic thin-films on either side of an intermediate layer. In the giant magnetoresistive effect, the electrical resistance through the "sandwich" or superlattice is lower if the magnetizations in the two separated ferromagnetic thin-films are parallel than it is if these magnetizations are antiparallel, i.e. directed in opposing directions. Further, the also present anisotropic magnetoresistive effect in very thin-films is considerably reduced from the bulk values therefor in thicker films due to surface scattering, whereas very thin-films are a fundamental requirement to obtain a significant giant magnetoresistive effect.

In addition, as indicated, the giant magnetoresistive effect can be increased by adding further alternate intermediate and ferromagnetic thin-film layers to extend the "sandwich" or superlattice structure. The giant magnetoresistive effect is sometimes called the "spin valve effect" in view of the explanation that a larger fraction of conduction electrons are allowed to move more freely from one ferromagnetic thin-film layer to another if the magnetizations in these layers are parallel than if they are antiparallel with the result that the magnetization states of the layers act as sort of a valve.

These magnetizations results often come about because of magnetic exchange coupling between the ferromagnetic thin-films separated by the intermediate layers, these intermediate layers typically formed from a nonferromagnetic transition metal as an electrical conductor. The effect of the exchange coupling between the ferromagnetic thin-film layers is determined to a substantial degree by the thickness of such an intermediate layer therebetween. The effect of the coupling between the separated ferromagnetic thin-film layers has been found to oscillate as a function of this separation thickness between these layers in being ferromagnetic coupling (such that the magnetizations of the separated layers are parallel to one another) and antiferromagnetic coupling (such that the magnetizations of the separated layers are opposed to one another, or antiparallel to one another). Thus, for some separation thicknesses, the layer coupling can be of zero value between extremes of such oscillations.

Exhibiting the giant magnetoresistive effect in a superlattice structure, or in an abbreviated superlattice structure formed by a three layer "sandwich" structure, requires that there be arrangements in connection therewith that permit the establishment alternatively of both parallel and antiparallel orientations of the magnetizations in the alternate ferromagnetic thin-film layers therein. One such arrangement is to have the separated ferromagnetic thin-films in the multilayer structure be antiferromagnetically coupled but to a sufficiently small degree so that the coupling field can be overcome by an external magnetic field.

Another arrangement is to form the ferromagnetic thin-film layers with alternating high and low coercivity materials so that the magnetization of the low coercivity material layers can be reversed without reversing the magnetizations of the others. A further alternative arrangement is to provide "soft" ferromagnetic thin-films and exchange couple every other one of them with an adjacent magnetically hard layer (forming a ferromagnetic thin-film double layer) so that the ferromagnetic double layer will be relatively unaffected by externally applied magnetic fields even though the magnetizations of the other ferromagnetic thin-film layers will be subject to being controlled by such an external field.

One further alternative arrangement, related to the first, is to provide such a multilayer structure that is, however, etched into strips such that demagnetizing effects and currents in such a strip can be used to orient the magnetizations antiparallel, and so that externally applied magnetic fields can orient the magnetizations parallel. Thus, parallel and antiparallel magnetizations can be established in the ferromagnetic thin-films of the structure as desired in a particular use. Such a structure must be fabricated so that any ferromagnetic or antiferromagnetic coupling between separated ferromagnetic films is not too strong so as to prevent such establishments of film magnetizations using practical interconnection arrangements.

A magnetic field sensor suited for fabrication with dimensions of a few microns or less to tens of microns or more can be fabricated that provides a suitable response to the presence of very small external magnetic fields and low power dissipation by substituting an electrical insulator for a conductor in the nonmagnetic intermediate layer. This sensor can be fabricated using ferromagnetic thin-film materials of similar or different kinds in each of the outer magnetic films provided in a "sandwich" structure on either side of an intermediate nonmagnetic layer which ferromagnetic films may be composite films, but this insulating intermediate nonmagnetic layer permits electrical current to effectively pass therethrough based primarily on a quantum electrodynamic effect "tunneling" current.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance, or conductance, characterizing this intermediate layer with respect to the "tunneling" current therethrough. The maximum fractional change in effective resistance is a function of the magnetic polarization of the conduction electrons given by $$(\Delta R/R) = 2P_1 P_2/(1 + P_1 P_2)$$

where $P_1$ and $P_2$ are the conduction electron spin polarizations of the two ferromagnetic layers. These polarizations appear dependent on the ratio of spin up to spin down electrons in the 3D shell of the transition elements used in the ferromagnetic thin-films, i.e. the spin polarization P of the conduction electrons. The fraction f of 3D electrons which are spin up have typical values of 0.75 for iron, 0.64 for cobalt and 0.56 for nickel. Conduction electrons in metals are normally S shell electrons which theoretically would be equally divided between spin up and spin down electrons. However, because of band splitting the conduction electrons in the magnetic layers are assumed to have a fraction of spin up electrons like that of the electrons in the 3D shell. The spin polarization is then determined from $P = 2f - 1$.

In addition, shape anisotropy is often used in such a sensor to provide different coercivities in the two ferromagnetic layers, and by forming one of the ferromagnetic layers to be thicker than the other. Such devices may be provided on a surface of a monolithic integrated circuit to thereby allow providing convenient electrical connections between each such sensor device and the operating circuitry therefor.

A "sandwich" structure for such a sensor, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized sensor structure.

The current-voltage characteristics of such "sandwich" structure sensors will exhibit a relatively linear change in the quantum electrodynamic effect "tunneling" current therethrough from one ferromagnetic layer through the barrier to the other with respect to the voltage provided across the sensor, i.e. across the barrier layer between these ferromagnetic layers, for relatively lower value voltages, but the current magnitude increases more than linearly for higher values of voltage across the sensor. As the voltage across the sensor increases, the fractional change in the "tunneling" current through the sensor, for the ferromagnetic layers having magnetizations changing from parallel to one another to antiparallel, decreases to being only half as great with several hundred millivolts across the sensor as occurs in the situation with a hundred or less millivolts across the sensor so that this fractional change with sensor voltage will range from a few percent to 20% or more. The fractional change in the resistance of the sensor for the ferromagnetic layers having magnetizations changing from parallel to one another to antiparallel increases to about one and one-half the room temperature values when the sensor is cooled to 77° K, but the "tunneling" current through the sensor increases by only about 10% to 20% indicating that the effective resistivity of the sensor is relatively insensitive to temperature (around 500 to 1000 ppm/° C).

The effective resistivity of such a sensor is set by the amount of "tunneling" current through the cell permitted by the barrier layer therein for the voltage across the sensor. The high sensitivity of the "tunneling" current to the thickness of the barrier layer leads to a wide range of sensor resistivities which have been observed to be from less than 60.0$\Omega$-$\mu m^2$ to 10,000M$\Omega$-$\mu m^2$. On the other hand, the barrier layer appears to permit relatively little magnetic coupling between the ferromagnetic layers thereacross with the coupling fields typically being only a few Oe. the ferromagnetic layers thereacross with the coupling fields typically being only a few Oe.

Magnetoresistive spin valve sensors have been used in a variety of applications. These include, for example, magnetic read heads in magnetic disk memories, land mines detection and current sensing in conductors. A typical spin-valve sensor based on the "giant magnetoresistive effect" (GMR), linear in its magnetoresistance versus applied external magnetic field characteristic, is fabricated, as indicated above, as a stack of magnetic and other materials layers forming a magnetoresistor that is quite long relative to its width with the length extending in a straight line or following a crenelated pattern as is shown in FIGS. 1A and 1B. One ferromagnetic layer therein is a reference layer having its direction of magnetization relatively fixed, or "pinned", with another ferromagnetic layer being provided therein as a "free" layer having its magnetization direction more easily rotated by external magnetic fields which are the fields intended to be sensed. This last layer is separated from the reference layer by a nonmagnetic material layer, which is an electrical conductor for a GMR device, along which magnetoresistance is controlled by the angle between the relative magnetization directions in the two ferromagnetic material layers. The pinned axis of the magnetization direction the pinned layer is fixed in the transverse direction, or across the magnetoresistor width, by exchange coupling with an antiferromagnetic material layer (e.g. IrMn, CrPtMn), while the easy axis of magnetization of the "free" layer lies along the magnetoresistor length.

FIG. 1A shows top view of several typical magnetoresistive spin-valve magnetic field sensors, 5, interconnected in sequence to form a series circuit portion by interconnections, 6. FIG. 1B shows a cross section view of one of these sensors. The stack of various kinds of material layers forming these magnetoresistor structures providing such a magnetoresistive spin-valve magnetic field sensor 5 is fabricated on a monolithic integrated circuit chip substrate, 10, that may contain monolithic integrated circuits to provide amplification, electrical power management, switching controls, and other circuit based operations.

A dielectric film, 11, typically 2000 Å of silicon nitride, is first deposited over substrate 10 to provide a smooth surface for further material layer depositions and to electrically insulate the magnetoresistor from what is contained in substrate 10 below. This layer and the subsequent layers forming magnetoresistor structure 5 are deposited by sputtering using RF diode sputtering or DC magnetron sputtering techniques in a vacuum deposition chamber. A buffer layer, 20, of tantalum 30 Å thick is first deposited on layer 11 followed by depositing permalloy, or NiFeCo, to form after etching a ferromagnetic material "free" layer, 24, that is 50 Å thick. Layer 24 is deposited in the presence of a magnetic field having a magnitude of 20 Oe in an initial selected direction to orient an induced easy axis in the layer in that direction.

Then a 30 Å thick copper layer, 25, is deposited on the free layer to form a nonmagnetic, electrically conductive intermediate layer on which a 40 Å thick cobalt layer, 26, is deposited to form after etching a "pinned" layer also in the presence of a magnetic field with a magnitude of 20 Oe in the initial selected direction. Layer 26 has its magnetization direction "pinned" by depositing an antiferromagnetic material (e.g., IrMn, CrPtMn) "pinning" layer, 27, again in the presence of a 20 Oe magnitude magnetic field in the initial selected direction, the antiferromagnetic material being CrPtMn to a thickness of 350 Å. A 50 Å thick tantalum interconnect buffer layer, 28, is provided on pinning layer 27 to protect the magnetoresistive structure during subsequent fabrication steps, and to facilitate good electrical contact to aluminum interconnection structures 6.

Following the provision of these layers, an annealing step is undertaken. The substrate and the stack are heated in the presence of a magnetic field with a magnitude of 3000 Oe in the initial selected direction with this field maintained during a one hour heating at 250° C. in forming gas and during the subsequent cooling to strengthen the pinning of layer 26 by layer 27, and to reduce the dispersion of the angular orientations of the easy axes from the initial selected direction over the extents thereof.

Magnetoresistor structures 5 are formed from this stack of deposited layers through a patterning process along with any other magnetoresistors being formed on the substrate. An etching mask of silicon nitride is provided through using patterned photoresist as an initial etching mask for patterning the silicon nitride in a Reactive Ion Etcher (RIE), and then using the resulting silicon nitride "hard mask" as an etching mask in an ion mill. The ion mill removes all materials in the deposited electrically conductive layers uncovered by the "hard mask", and so exposed to the etching, as these materials in layer 28, uncovered by the mask, and in each layer below those portions of layer 28 are etched away down to silicon nitride layer 11 on substrate 10 so that the lengths of magnetoresistor structures resulting are parallel to the initial selected direction. Much of the silicon nitride hard mask is removed in the ion mill as well.

A passivating silicon nitride layer, 13, is deposited with sputter deposition over the magnetoresistor structure 5 to a thickness of about 2000 Å. Photolithography is used to form an etching mask for using reactive ion etching to cut contact holes in passivation layer 13. Aluminum interconnection metal is deposited over the remaining portions of passivation layer 13 and into the contact holes to a thickness of about 1500 Å. This aluminum layer is patterned using a photoresist etching mask and reactive ion etching again. A final passivating layer, 15, is provided by sputter deposition to a thickness of 1.5 $\mu$m.

Again, an annealing of the resulting magnetoresistors is performed, first, in the presence of a magnetic field with a magnitude of 3000 Oe in the initial selected direction now along the lengths of the magnetoresistors with this field maintained during a one hour heating at 240° C. in forming gas and during the subsequent cooling to reduce the dispersion of the angular orientations of the easy axes from the lengths of the magnetic material layers over the extents thereof. A further annealing step follows in the presence of a magnetic field with a magnitude of 3000 Oe perpendicular to the initial selected direction, and so along the widths of the resulting magnetoresistors, with this field maintained during a two hour heating at 240° C. in forming gas, and then at 265° C. for one hour, to reorient the pinned direction of layer 26 to be along the width of the magnetoresistors.

The annealing is completed in a further step in the presence of a magnetic field with a magnitude of 3000 Oe parallel to the initial selected direction, and so along the lengths of the resulting magnetoresistors, with this field maintained during a two hour heating at 160° C. in forming gas and during the subsequent cooling to reduce the dispersion of the angular orientations of the easy axes in free layer 24 from the initial selected direction over the extent thereof but at a reduced temperature to avoid affecting the direction of pinning set in layers 26 and 27. These last two annealing steps result in a pinning direction orientation at some relative angle to the widths of the magnetosistors to thereby provide a component of the interlayer coupling along the lengths thereof to provide some bias to aid in minimizing the device hysteresis.

Plots of the high externally applied magnetic field range and the low externally applied magnetic field range response characteristics of a typical spin valve are shown in the graphs of FIGS. 2A and 2B, respectively. The device resistance versus externally applied magnetic field response characteristics of a magnetic tunnel junction are qualitatively similar. However, the magnitudes of the resistance values and the resistance change values may be quite different. FIG. 2B shows that at moderately high positive externally applied magnetic fields the device resistance is largest, corresponding to the antiparallel alignment of the magnetizations of free and fixed layers 24 and 26; and the device resistance is smallest for moderately high negative externally applied magnetic fields, corresponding to the parallel alignment of the magnetizations of free and fixed layers 24 and 26.

FIG. 3 shows a graph in which the resistance of the device of FIG. 1 as an approximate fraction of its maximum resistance versus the angle between the magnetizations of free and fixed ferromagnetic layers 24 and 26 on either side of intermediate layer 25. This relationship is obtained by applying an external magnetic field along the direction indicated by the angle that is larger than the magnetic saturation field of free layer 24 but less than the magnetic saturation field of fixed layer 26.

Similarly, a typical spin dependent tunneling sensor, also linear in its magnetoresistance versus applied external magnetic field characteristic, is again fabricated as a stack of magnetic and other materials layers forming a magnetoresistor that is quite long relative to its width with the length extending in a straight line or following a serpentine or crenelated pattern. Here, too, as can again be represented in FIGS. 1A and 1B, one ferromagnetic layer therein is reference layer 26 having its direction of magnetization relatively fixed, or "pinned", with another ferromagnetic layer being provided therein as "free" layer 24 having its magnetization more easily rotated by external magnetic fields. This last layer is separated from the reference layer in this instance, however, by electrically insulative material barrier layer 25, typically aluminum oxide 15 Å thick, through which electron tunneling is controlled by the angle between the relative magnetization directions in the two ferromagnetic layers. Once again, the easy axis of the magnetization of the pinned layer is fixed in the transverse direction, or across the magnetoresistor width, by exchange coupling with antiferromagnetic material layer 27 (e.g. IrMn, CrPtMn), while the easy axis of magnetization of the "free" layer lies along the magnetoresistor length.

Patterned, micron-size exchange biased spin-valve sensors exhibit quite different giant magnetoresistance effect responses as compared to the stack of sheet films from which the sensors are formed by patterning due to the strong magnetostatic interaction between the ferromagnetic layers in the resulting patterned sensors. This is also true of spin dependent tunneling sensors. The effect of the fringing fields from the pinned ferromagnetic material layer in such sensors detrimentally affects the external applied magnetic fields induced magnetization reversals of the free layer which causes a degradation in the linearity of its magnetoresistance versus applied external magnetic field characteristic, or linearity, of these sensors, and also an unwanted bias point shift of the free layer on such characteristics which limits the dynamic response range of the sensors.

The major challenges in making linear spin-valve sensors are to reduce the hysteresis and optimize the bias point. The general techniques used are biasing the sensor with an external field generated either by permanent magnets or patterned coils with driving currents. Thus, to ensure linearity, a longitudinal bias magnetic field is usually applied to overcome the influence of the demagnetization fields from both the pinned and free layers to thereby induce quiet and single domain behavior for the free layer. The general rule to achieve an optimized bias point for linear spin-valve sensor with a single free layer is to make a balance of the fringe field from the pinned layer with ferromagnetic interlayer coupling between the pinned and the free layers. However, all such measures complicate the fabrication process and usually lead to the resulting sensor consuming an undue amount of electrical power.

BRIEF SUMMARY OF THE INVENTION

The present invention provides a ferromagnetic thin-film based magnetic field sensor with a sensing structure supported on a substrate having a nonmagnetic intermediate layer with two major surfaces on opposite sides thereof upon one of which a magnetization reference layer is provided. An anisotropic ferromagnetic material sensing layer is provided on that remaining one of the intermediate layer major surfaces. A spacer layer is provided on the sensing film and across this sensing film from one of the nonmagnetic intermediate layer major surfaces with the spacer layer having a major surface on a side thereof opposite the sensing film. An augmenting film of an anisotropic ferromagnetic material is provided on the spacer layer major surface with the spacer layer being sufficiently thick so as to significantly reduce or eliminate topological coupling between the sensing and augmenting films, and to significantly randomize spin states of emerging electrons traversing therethrough.

DETAILED DESCRIPTION

Two important aspects of the present invention enabling reduced hysteresis are 1) the pinning of the pinned layer in a direction at an angle relative to the direction of the magnetoresistor length so that a component of the interlayer coupling between the free and pinned layers can provide a bias to the free layer along the magnetoresistor length, and 2) to employ a spin-valve sensor having an augmenting second free ferromagnetic material layer. The present invention not only effectively reduces the sensor hysteresis in the sensor magnetoresistance versus applied external magnetic field characteristic but also provide a means to adjust and optimize the bias point of the linear spin-valve sensor on that characteristic. In the present invention, the spin-valve sensor is provided with a second free ferromagnetic material layer as contrasted with the usual single free layer. One of these free layers is the sensing layer which contributes to the sensor giant magnetoresistive effect response while the other free layer is an interacting layer which influences the performance of the sensing layer but does not contribute to the sensor giant magnetoresistive effect response. This innovative approach not only can significantly reduce the hysteresis of the top free layer but also provide a means to adjust and optimize the bias points of linear spin-valve sensors through adjusting the thickness of the interaction layer.

Figure 2A:
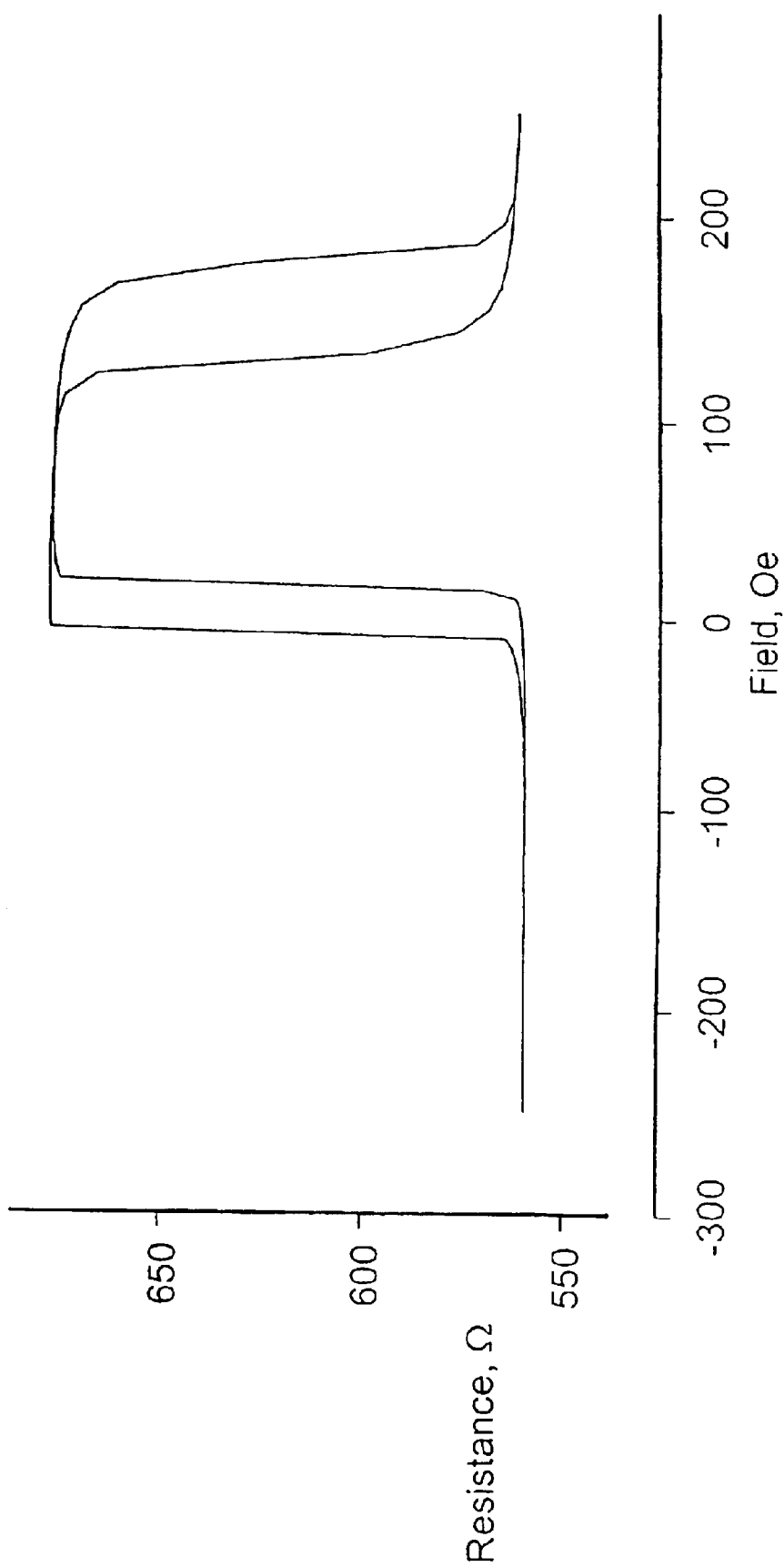
FIGS. 2A and 2B are large and small field range plots of resistance versus external applied magnetic field along the pinned layer magnetization direction of a typical spin valve structure.
Figure 2B:
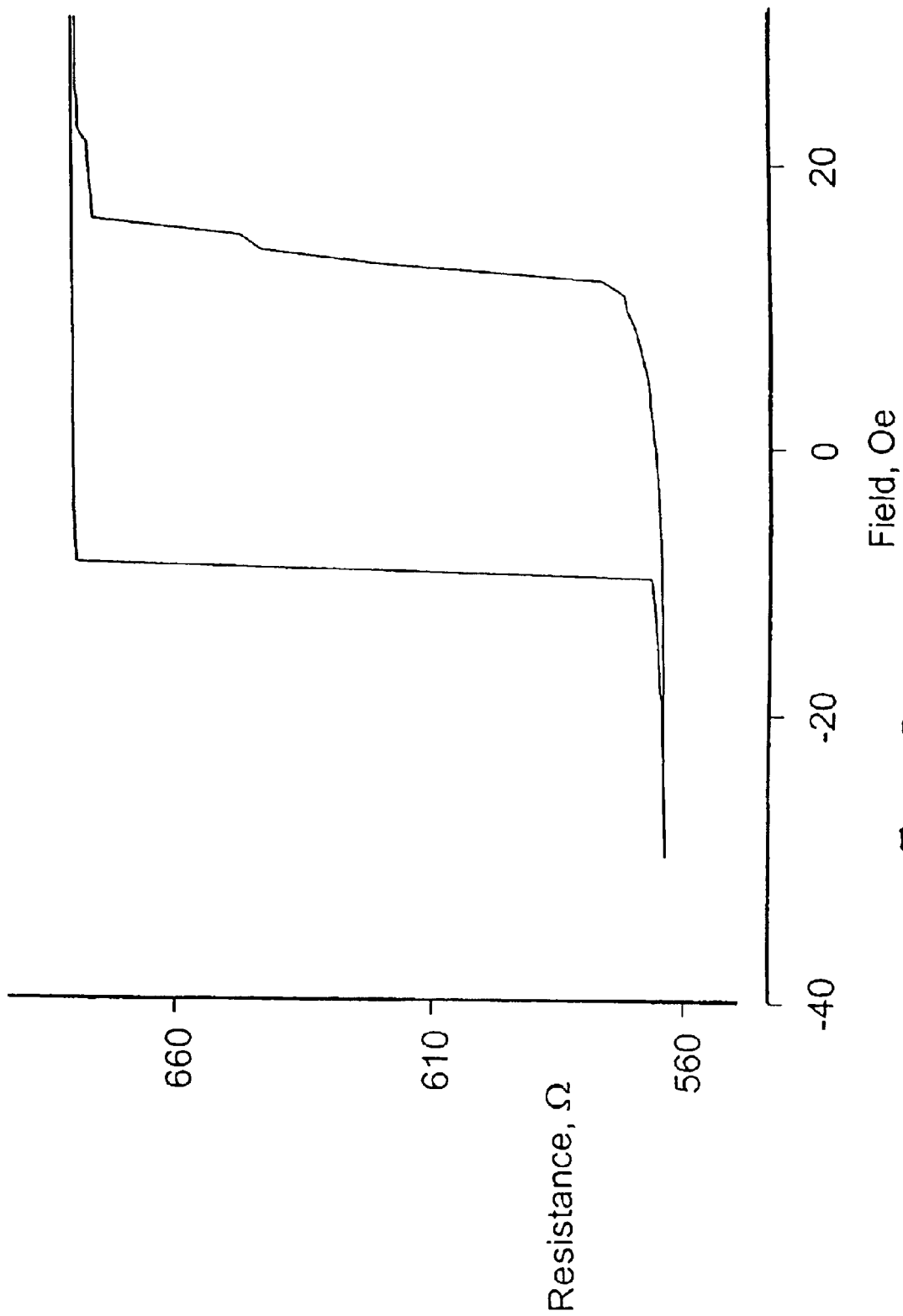
Figure 3:
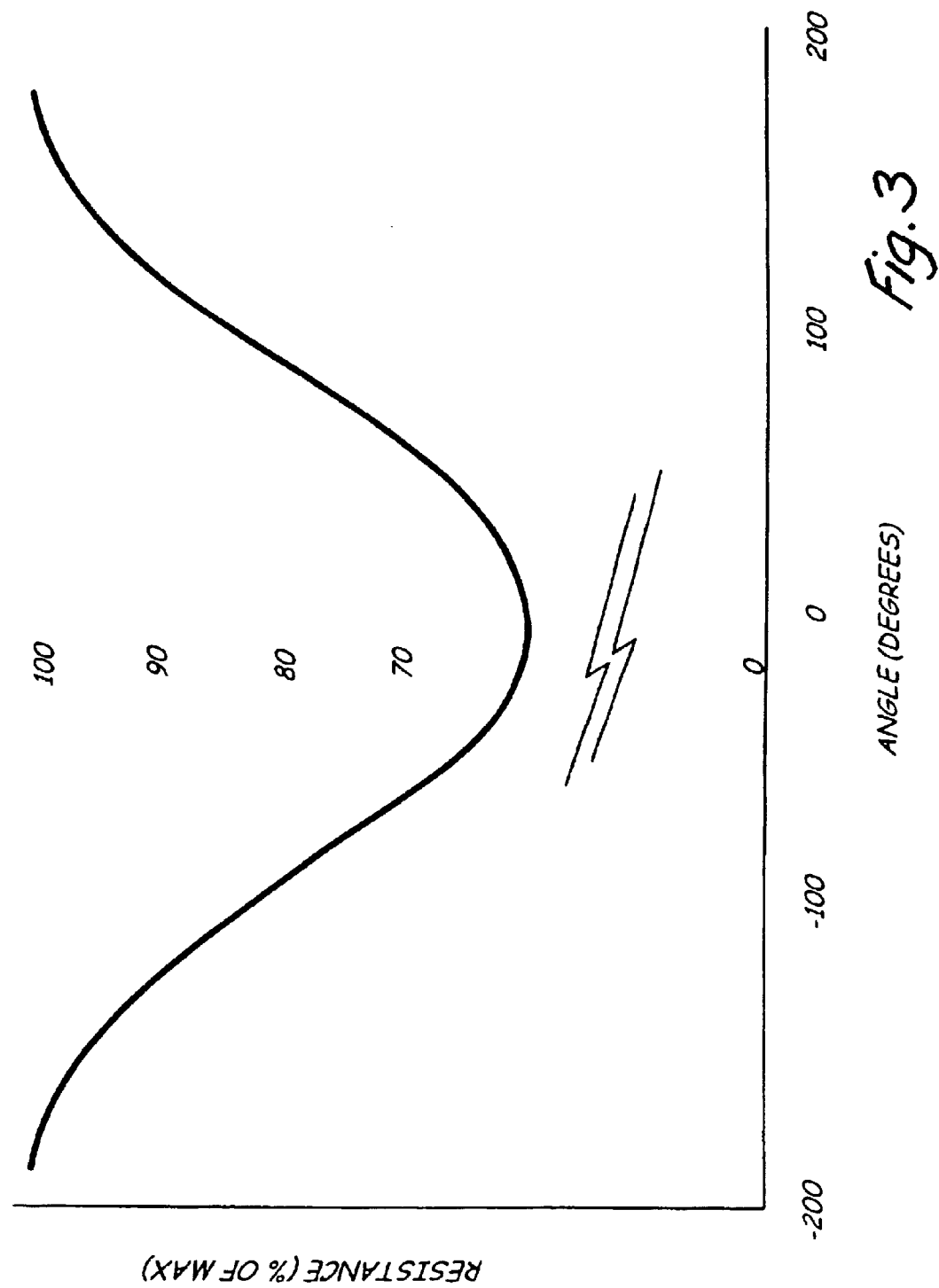
FIG. 3 is a plot of resistance versus angle theta for a typical spin valve structure.
Figure 4A:
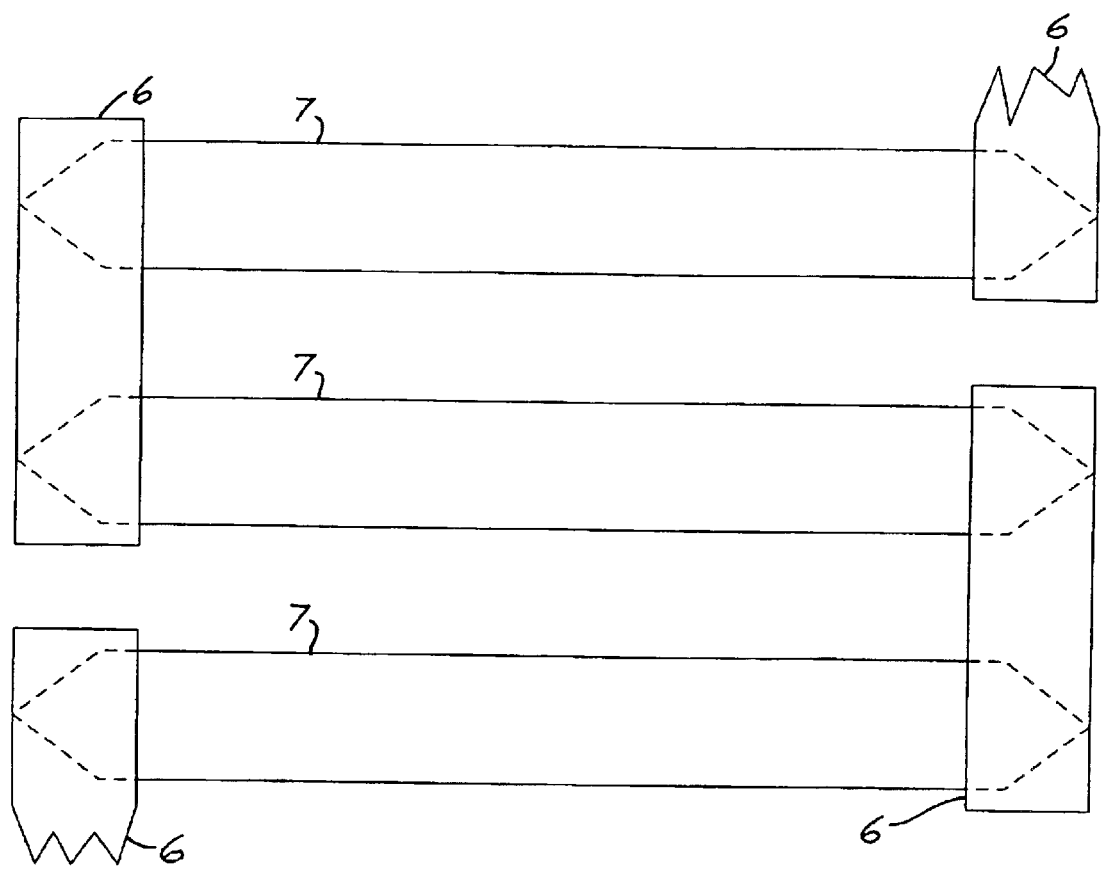
FIGS. 4A and 4B are top and cross sectional views, respectively, of a spin valve structure with two free layers.
Figure 4B:
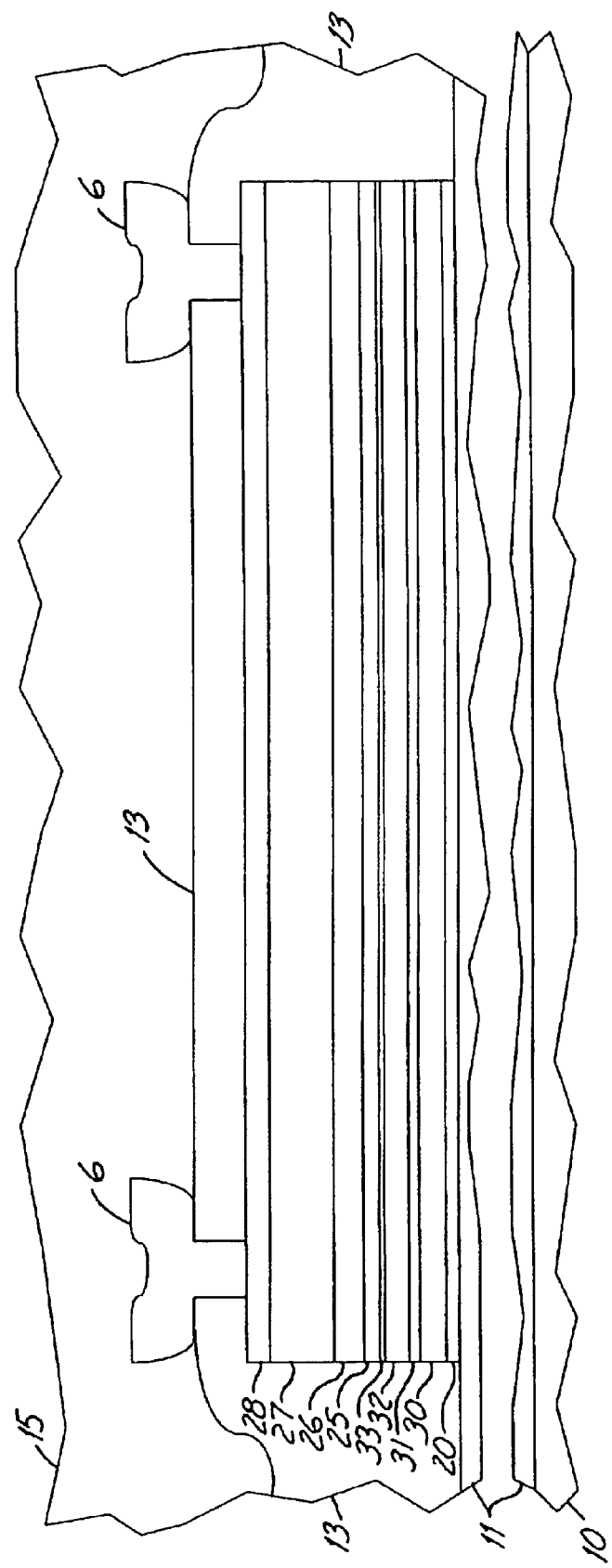

FIG. 4A shows a top view of several magnetoresistive spin-valve magnetic field sensors, 7, replacing sensor 5 in FIG. 2A that are again interconnected in sequence to form a series circuit portion by interconnections 6. These sensors each have two free ferromagnetic material layers separated by nonmagnetic spacer layer in addition to having a pinned ferromagnetic material layer separated from the first two free layers by an electrically conductive intermediate layer. FIG. 4B shows a cross section view of one of these sensors. The magnetization direction of the pinned layer is fixed in the transverse direction, or across the sensor width, by exchange coupling with an antiferromagnetic material layer. The two free ferromagnetic material layers are separated from one another by the spacer layer which is not of a magnetic material but instead can be of tantalum as an electrical conductor or alternatively can be an electrical insulating layer. This nonmagnetic spacer layer between the free layers should be thick enough to assure 1) that layer surface roughness based magnetostatic coupling, or topological or 'orange peel' coupling, between the two free layers is negligible, and 2) that no electron can pass therethrough without losing its initial spin state, i.e. thick enough to randomize the electron spin states of any layer traversing electrons upon emergence therefrom, so that only the signal response from the free layer closest to the intermediate layer can contribute to the giant magnetoresistive response of the sensor in the presence of externally applied magnetic fields.

If an external magnetic field $H_a$ is applied in a direction parallel to the transverse direction of the sensor, i.e. across its width, the resulting giant magnetoresistive sensor response is given by $\Delta R \propto \sin \theta_1 \propto H_a$. The interactive free layer, that is, the free layer farthest from the intermediate layer, does not contribute to the giant magnetoresistive sensor response, but its interaction with the sensing free layer, that is, the free layer closest to the intermediate layer, will significantly reduce the hysteresis of that sensing free layer.

The stack of various kinds of material layers used in forming these magnetoresistor structures to thereby provide such a magnetoresistive spin-valve magnetic field sensor 7 is again fabricated on a monolithic integrated circuit chip substrate 10 which can again contain integrated circuits used in operating the magnetoresistor sensors or to make use of the sensed external magnetic field information provided by the output signals of such sensors, or both. Fabrication of these magnetoresistor structures proceeds much as the fabrication of the structures in FIGS. 1A and 1B. Buffer layer 20 of tantalum, now 40 Å thick, is again first deposited on dielectric layer 11. Upon this buffer layer is deposited a 50 Å thick permalloy, or NiFeCo, layer, 30, to serve after etching as the added augmenting, interacting ferromagnetic material free layer. Here, too, layer 30 is deposited in the presence of a magnetic field having a magnitude of 20 Oe in an initial selected direction to orient an induced easy axis in this layer in that direction.

A 50 Å thick tantalum spacer layer, 31, is next deposited on interacting free layer 30. Thereafter, a 40 Å thick permalloy, or NiFeCo, layer, 32, is deposited on spacer layer 31 with layer 32 to serve after etching as the sensing ferromagnetic material free layer. The deposition of layer 32 is followed by depositing thereon a 15 Å thick cobalt iron, or CoFe, magnetoresistance enhancement layer, 33, on layer 32 as the remainder of the sensing free layer thus formed as a composite layer, with both of these last two layers being deposited in the presence of a magnetic field having a magnitude of 20 Oe in the initial selected direction.

The remaining layers to be deposited are provided essentially as done in connection with FIG. 1. Copper layer 25, now 25 Å thick, is deposited on the sensing free layer to form a nonmagnetic, electrically conductive intermediate layer. A composite layer is provided on this intermediate layer to serve as a reference layer structure after etching. This composite layer starts with a cobalt iron layer 26, now 40 Å thick, that is deposited again as the "pinned" layer and again in the presence of a magnetic field with a magnitude of 20 Oe which can either be in the initial selected direction or perpendicular thereto. Layer 26 has its magnetization direction "pinned" by depositing thereon antiferromagnetic material to form "pinning" layer 27, also in the presence of a magnetic field with a magnitude of 20 Oe which can also be in or perpendicular to the initial selected direction, with the antiferromagnetic material again being CrPtMn but to a thickness of 325 Å. These two layers, as indicated, will form a magnetization direction reference layer structure in the finally formed magnetoresistors. Tantalum interconnect buffer layer 28 is again provided on pinning layer 27 to a thickness of 50 Å to protect the magnetoresistive structure during subsequent fabrication steps, and to facilitate good electrical contact to aluminum interconnection structures 6.

Once again following the provision of these layers to form a stack thereof, an annealing step is undertaken. The substrate and the stack are heated in the presence of a magnetic field with a magnitude of 3000 Oe in the initial selected direction with this field being maintained during a one hour heating at 250° C. in forming gas, and during the subsequent cooling. This is done for the same purposes of strengthening the pinning of layer 26 by layer 27, and the reducing of the dispersion of the angular orientations of the easy axes from the initial selected direction over the extents thereof.

Magnetoresistor structures 7 are formed from this stack of deposited layers again through essentially the patterning process described above using reactive ion etching, ion milling and various etching masks with the metallization of the structures being completed thereafter as described above. The patterned stacks for structures 7 are formed so that the selected initial direction is the same as the length direction of the free layers in the resulting magnetoresistors. Also, as before, the resulting magnetoresistors undergo the same final annealing processes to again reduce dispersion and reorient the pinned direction of layer 26 to be along the width of the magnetoresistors.

Figure 5A:
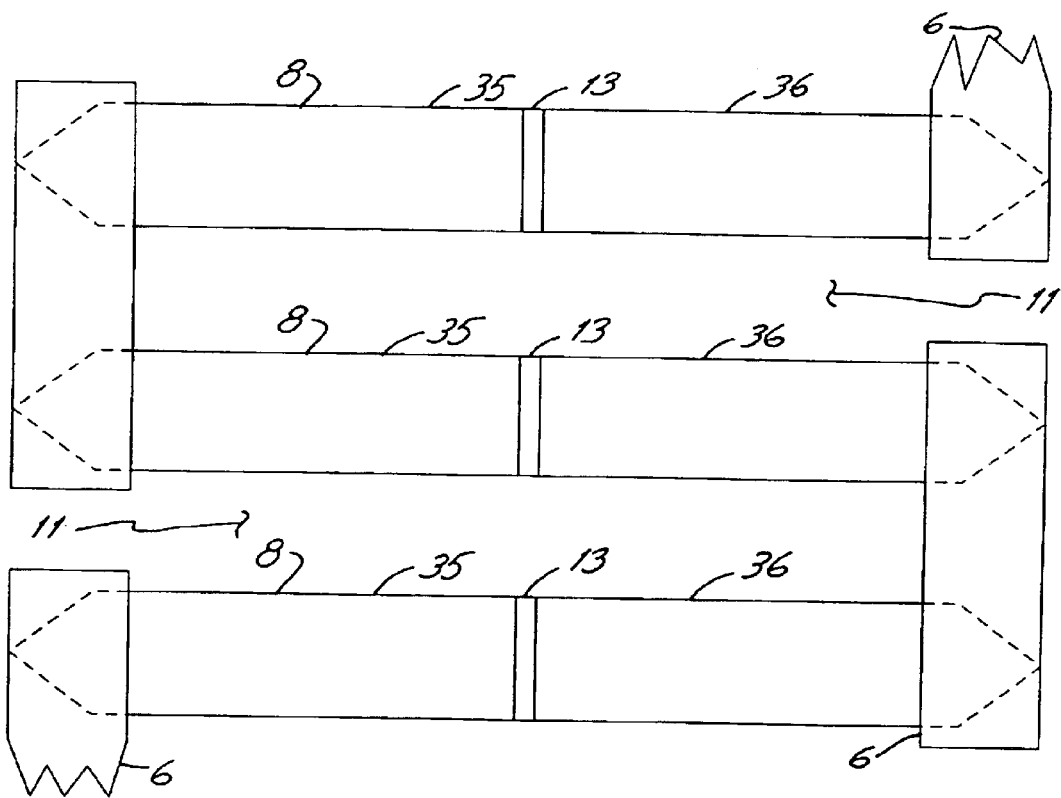
FIGS. 5A and 5B are top and cross sectional views, respectively, of a pinned spin dependent tunnel junction with two free layers.
Figure 5B:
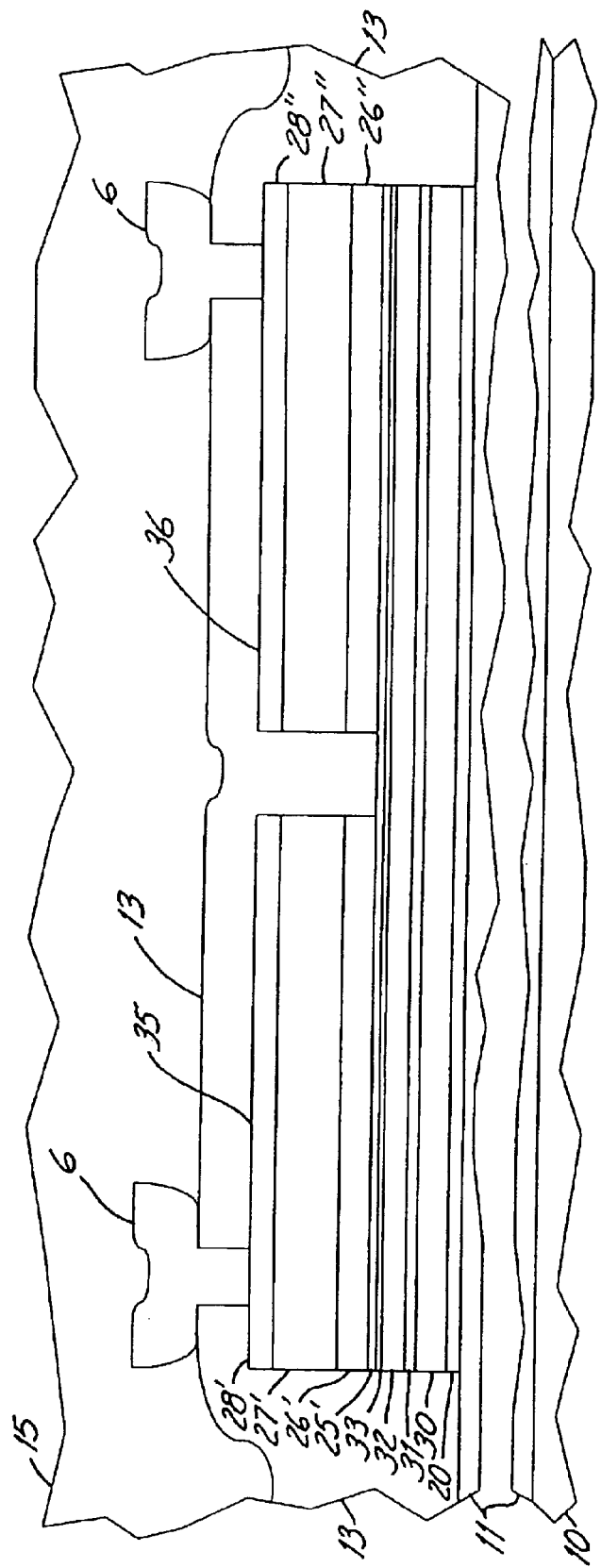

FIG. 5A shows top view of several magnetoresistive side-by-side pinned reference layer, spin dependent tunneling structures, 8, each using two free layers interconnected in sequence to form a series circuit portion by interconnections 6. These sensors each have two free ferromagnetic material layers separated from one another by a spacer layer in addition to having a pinned ferromagnetic material layer separated from the two free layers by an electrically insulative intermediate layer. FIG. 5B shows a cross section view of one of these sensors with the side-by-side structural aspects apparent.

Figure 1A:
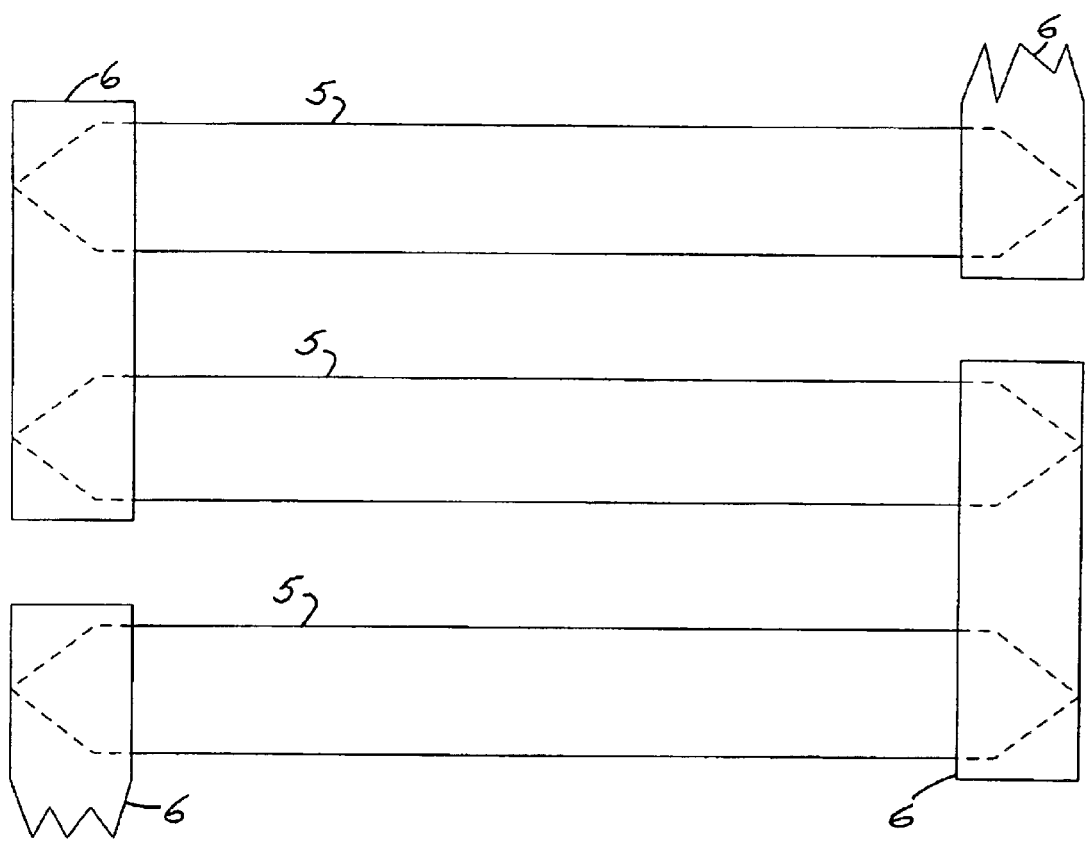
FIGS. 1A and 1B are top and cross sectional views, respectively, of a typical "spin valve" magnetoresistive structure.
Figure 1B:
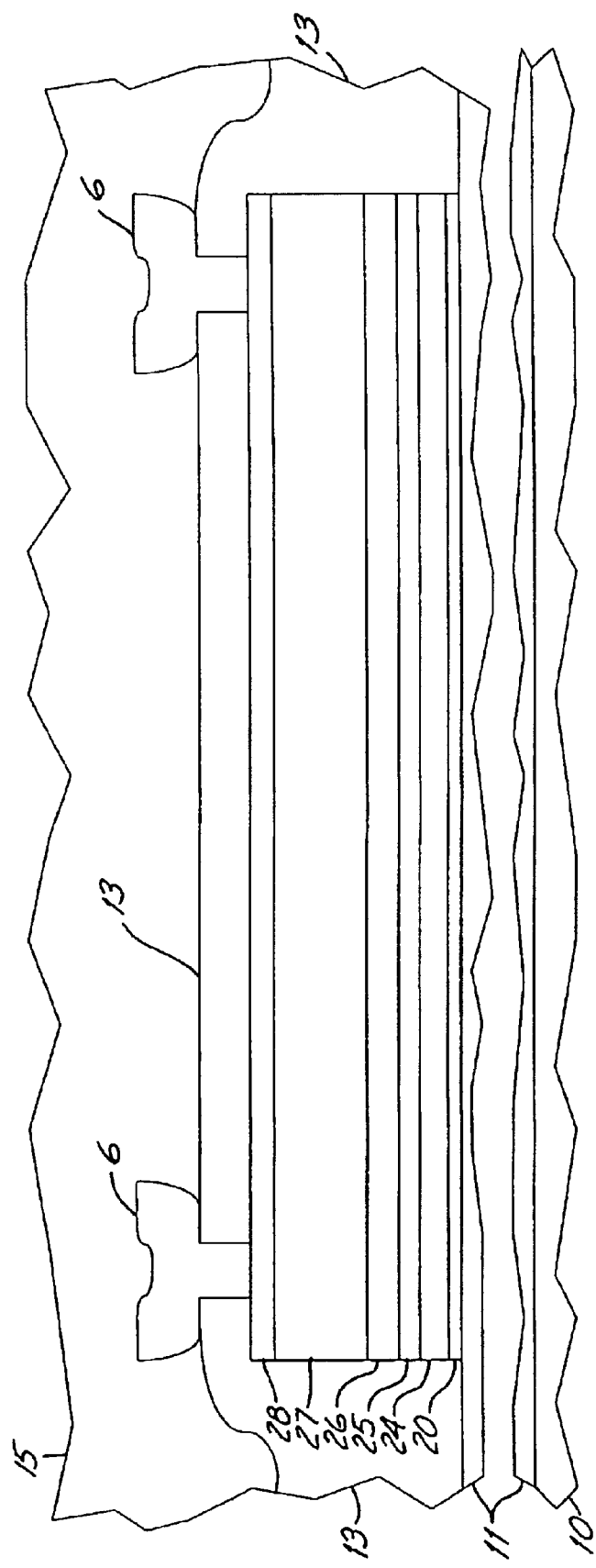

Fabrication of this structure proceeds much as for the structure shown in FIGS. 1A and 1B, and in FIGS. 4A and 4B. The magnetization direction of the pinned layer is again fixed in the transverse direction, or across the sensor width, by exchange coupling with an antiferromagnetic material layer. The two free ferromagnetic material layers are separated here again from one another by a spacer layer which is not of a magnetic material but instead can be of tantalum as an electrical conductor or alternatively can be an electrical insulating layer. This nonmagnetic spacer layer between the free layers should here, too, be thick enough to assure 1) that layer surface roughness based magnetostatic coupling, or topological or 'orange peel', coupling between the two free layers is negligible, and 2) that no electron can pass therethrough without losing its spin state, i.e. thick enough to randomize the electron spin states of any layer traversing electrons upon emergence therefrom, so that only the signal response from the free layer closest to the intermediate layer can contribute to the giant magnetoresistive response of the sensor in the presence of externally applied magnetic fields.

If an external magnetic field $H_a$ is applied in the transverse direction of the sensor, i.e. across its width, the resulting giant magnetoresistive sensor response is given by $\Delta R \propto \sin \theta_1 \propto H_a$. Again, the interactive free layer, the free layer farthest from the intermediate layer, does not contribute to the giant magnetoresistive sensor response, but its interaction with the sensing free layer, the free layer closest to the intermediate layer, will significantly reduce the hysteresis of that sensing free layer.

The stack of various kinds of material layers forming these magnetoresistor structures providing such a magnetoresistive spin dependent tunneling magnetic field sensor 8 is again fabricated on a monolithic integrated circuit chip substrate 10 which again may contain integrated circuits useful with the magnetoresistor sensors. Buffer layer 20 of tantalum, again 40 Å thick, is again first deposited on dielectric layer 11. Upon this buffer layer is deposited a 50 Å thick permalloy, or NiFeCo, layer, 30, to serve after etching as the added augmenting, interacting ferromagnetic material free layer. Here, too, layer 30 is deposited in the presence of a magnetic field having a magnitude of 20 Oe in an initial selected direction to orient an induced easy axis in this layer in that direction.

A 50 Å thick tantalum spacer layer, 31, is thereafter deposited on interacting free layer 30. Next, a 40 Å thick permalloy, or NiFeCo, layer, 32, is deposited on spacer layer 31 with layer 32 to serve after etching as the sensing ferromagnetic material free layer. The deposition of layer 32 is followed by depositing thereon a 15 Å thick cobalt iron, or CoFe, magnetoresistance enhancement layer 33 on layer 32 as the remainder of the sensing free layer as a composite layer, with both of these last two layers being deposited in the presence of a magnetic field having a magnitude of 20 Oe in the initial selected direction.

Rather than a copper layer 25, an aluminum layer of 15 Å thickness is deposited on the sensing free layer and oxidized to form an aluminum oxide barrier 25' as a nonmagnetic, electrically insulative intermediate layer. On this barrier layer is provided a composite layer to serve as a reference layer structure following etching with a cobalt iron layer, 26', that is 40 Å thick and is deposited again as the "pinned" layer once again in the presence of a magnetic field with a magnitude of 20 Oe in either the initial selected direction or a direction perpendicular thereto. Layer 26' has its magnetization direction "pinned" by depositing thereon antiferromagnetic material "pinning" layer, 27', also in the presence of a magnetic field with a magnitude of 20 Oe which can either be in or perpendicular to the initial selected direction, with the antiferromagnetic material again being CrPtMn to a thickness of 325 Å. A tantalum interconnect buffer layer, 28', is again provided on pinning layer 27' to a thickness of 50 Å to protect the magnetoresistive structure during subsequent fabrication steps, and to facilitate after etching good electrical contact to aluminum interconnection structures 6.

Once more following the provision of these layers to form a stack thereof, an annealing step is undertaken. The substrate and the stack are heated in the presence of a magnetic field with a magnitude of 3000 Oe in the initial selected direction with this field maintained during a one hour heating at 250° C. in forming gas, and during the subsequent cooling. This is done for the same purposes of strengthening the pinning of layer 26' by layer 27', and reducing the dispersion of the angular orientations of the easy axes from the initial selected direction over the extents thereof.

In the resulting device, the free layers are formed as continuous layers beneath two, split apart reference layers to thereby form side-by-side spin dependent tunneling structures that are provided by performing two etchings. The first etching is begun by using patterned photoresist to form a reactive ion etching mask for use in patterning a deposited silicon nitride layer that becomes a "hard mask" once the reactive ion etching process removes unwanted regions of this silicon nitride layer that remain uncovered by the patterned photoresist. The resulting hard mask is used in an ion milling step that removes all materials uncovered by the "hard mask" and so exposed to the etchings, those materials in layer 28' uncovered by the mask, and in each layer below those portions of layer 28', are etched away down to aluminum oxide tunnel barrier layer 25' to thereby form two side-by-side reference layer structures, 35 and 36, each supported on barrier layer 25'. Reference layer structure 35 comprises pinned layer 26', pinning layer 27', and a protective layer 28'. Similarly, reference layer structure 36 comprises a pinned layer, now designated 26", a pinning layer, now designated 27", and a protective layer, now designated 28".

A similarly formed hard mask is provided and used for a second ion milling step to remove all materials uncovered by this second "hard mask", and so exposed to etching, as those portions of barrier layer 25', and the portions of each layer therebelow, are etched away down to silicon nitride layer 11 to form the interconnected free layers below these two reference layers and to separate sensors 8 from one another. Side-by-side reference layer structures 35 and 36 are formed where the masks for these two etches have coinciding surface covering portions over the stack surface. Those stack surface portions at which only the second mask provided cover are locations where only the interconnected free layer structure remains. All other parts of the initial stack have no remaining conductive material therefrom remaining, i.e. have just layer 11 present where they were present prior to etching. Thus, two tunnel junctions are formed below reference layer structures 35 and 36 which are each positioned over the common free layer structure on the opposite side of barrier layer 25' therefrom.

As before, silicon nitride passivation layer 13 is deposited over the side-by-side tunnel junction structure, contact holes etched into it using reactive ion etching. Aluminum interconnect metal is deposited over the resulting opened layer and into the contact holes, and then etched using reactive ion etching to form interconnections 6 which can be connected to other tunnel junctions or other circuit elements. Again, as before, the resulting magnetoresistors undergo the same final annealing processes that were used in connection with forming the magnetoresistors of FIGS. 1A and 1B, and also FIGS. 4A and 4B, to reduce dispersion and to reorient the pinned direction of layers 26' and 26" to be along the widths of the magnetoresistors.

The dynamic behavior of the resulting spin valve sensors, as shown in FIGS. 4A and 4B, with two ferromagnetic material free layers can be predicted on a micromagnetic analysis basis by the energy involved in both free layers during a magnetization reversal of the sensing free layer. Considering a single domain model for the ferromagnetic material free layers as shown in the perspective view schematic model of FIG. 6 derived from FIG. 4B with coordinate systems and pinned axis direction as indicated there, the energies in the two free layers 32, 33 and 30 can be expressed for an externally applied field H by $$E_1 = K_{e1} \sin^2 \theta_1 - HM_1 \sin \theta_1 - H_p M_1 \sin \theta_1 - (-H_{in}) M_1 \sin \theta_1 - (H_{d2}) M_1 \sin \theta_1.$$

and $$E_2 = K_{e2} \sin^2 \theta_2 - HM_2 \sin \theta_2 - H_p M_2 \sin \theta_2 - H_{d1} M_2 \sin \theta_2.$$

Here, $K_{e1}$ and $K_{e2}$ are respectively the effective anisotropies (mixed effect of the induced and shape anisotropies) of ferromagnetic material sensing and interactive free layers 32, 33 and 30; $H_p$ is the fringe field from pinned layer 26; and $H_{k1}$ and $H_{k2}$ are the shape anisotropy fields of sensing and interactive free layers 32,33 and 30, respectively. $M_1$ and $M_2$ are the saturation magnetizations at layers 32,33 and 30, respectively. $H_{in}$ is the interlayer coupling between pinned layer 26 and sensing free layer 32,33. The very last terms in both of these equations are due to the interaction between the sensing and interactive free layers 32,33 and 30. The $H_{d1}$ and $H_{d2}$ are, respectively, demagnetization fields from sensing and interactive free layers 32,33 and 30.

The approach here using a single domain model ignores that multiple domains may be created and annihilated during reorientations of the layer magnetizations. However, the results obtained will provide sufficient detail to suggest proper sensor design principles and performance optimizations with regard to the operation range, bias point, sensitivity, etc.

Since the demagnetization field for interactive free layer 30 is known to be expressible as $$H_{d2} = -\frac{4\pi M_2 t_2}{w} \sin\theta_2 = -H_{k2} \sin\theta_2$$

the energy $E_1$ of sensing free layer 32, 33 can be rewritten to be $$E_1 = K_{e1} \sin^2 \theta_1 - HM_1 \sin \theta_1 - H_p M_1 \sin \theta_1 + H_{in} M_1 \sin \theta_1 + H_{k2} M_1 \sin \theta_2 \sin \theta_1$$

where $$H_{k2} = \frac{4\pi M_2 t_2}{w}$$

is an effective field representing the shape anisotropy of interactive free layer 30.

Similar to sensing free layer 32, 33, the energy $E_2$ of interactive free layer 30 can be rewritten to be $$E_2 = K_{e2} \sin^2 \theta_2 - HM_2 \sin \theta_2 - H_p M_2 \sin \theta_2 + H_{k1} M_2 \sin \theta_1 \sin \theta_2$$

where $$H_{k1} = \frac{4\pi M_1 t_1}{w}$$

is an effective field representing the shape anisotropy of sensing free layer 32, 33.

The torque balance equilibrium of sensing free layer 32, 33 occurs at the minimum of the layer magnetic energy and so can be obtained by setting the derivative thereof with respect to its magnetization rotation angle to zero, i.e.

$$\frac{\partial E_1}{\partial \theta_1} = 0,$$

or $$2K_{e1} \sin \theta_1 \cos \theta_1 - HM_1 \cos \theta_1 - H_p M_1 \cos \theta_1 + H_{in} M_1 \cos \theta_1 + H_{k2} M_1 \sin \theta_2 \cos \theta_1 = 0.$$

After cancelling $M_1 \cos \theta_1$ from this last equation the first torque balance equation is obtained as $$H_{e1} \sin \theta_1 + H_{k2} \sin \theta_2 - (H + H_p - H_{in}) = 0$$

where $$H_{e1} = \frac{2K_{e1}}{M_1}$$

is the effective mixed cause anisotropy of sensing free layer 32,33.

Similarly, torque balance equilibrium of interactive free layer 30, occurring at the minimum of the layer magnetic energy with respect to the angle of rotation of the layer magnetization, can be obtained by setting the derivative thereof to zero, or $$\frac{\partial E_2}{\partial \theta_2} = 0,$$

to give, after similar manipulation, the last torque balance equation of $$H_{e2} \sin \theta_2 + H_{k1} \sin \theta_1 - (H + H_p) = 0$$

where $$H_{e2} = \frac{2K_{e2}}{M_2},$$

is the effective mixed cause anisotropy of interactive free layer 30.

From the first and last torque balance equations found above for the sensing and interactive free layers, respectively, the layer magnetization rotation angles $\theta_1$ and $\theta_2$ can be determined. From the last torque balance equation, $$\sin\theta_2 = -\frac{H_{kl}}{H_{e2}}\sin\theta_1 + \frac{H+H_p}{H_{e2}}.$$

If the effective anisotropy of interactive free layer 30 is less than or equal to that of sensing free layer 32, 33, then the magnetization of layer 30 will always saturate in the positive direction across the sensor width for an externally applied magnetic field before layer 32, 33 does, and layer 30 will always saturate after layer 32, 33 does for an external magnetic field applied in the negative direction across the width of the sensor. Consider first the situation in which interactive free layer 30 is always saturated in the positive y axis direction so that $\theta_2=90°$, i.e. along the reference layer structure pinned magnetization axis direction, by an externally applied magnetic field that is applied along the width of the sensor in the operating range available for sensing free layer 32,33. Thus, $\sin\theta_2=1$. Then, having layer 30 always saturated in the positive direction over the sensing, or operating range of sensing free layer 32, 33 requires, from the last torque balance equation above for interactive free layer 30, that $$\frac{H+H_p-H_{kl}\sin\theta_1}{H_{e2}} \geq 1.$$

or $$H+H_p-H_{k1}\sin\theta_1 \geq H_{e2}.$$

As a basis for determining the bias point, assign $\theta_1=0$ to represent the condition of an external bias magnetic field applied along the width of the sensor needed to keep the magnetization of sensing layer 30 oriented along the easy axis thereof parallel to the length of the sensor, where the sensor is most sensitive and linear, against the effects of the effective internal biasing fields. Then, while maintaining the magnetic energy balance in the assumed situation in which $\sin\theta_2=1$, the bias point $H=H_b$ can be calculated from the first resulting torque balance equation for sensing free layer 32, 33 as $$H_b = H_{in} + H_{k2} - H_p.$$

This is the needed externally applied field to counter the remaining sensor based or internal fields to result in a net zero bias. The operating range available to the linear spin-valve is set by the effective anisotropy fields about the bias point where saturation of sensing free layer 30 begins and is given by $$H_b - H_{e1} \leq H \leq H_b + H_{e1}.$$

If the inequality preceding the last for interactive free layer 30 being saturated is satisfied at $H=H_b-H_{e1}$, then interactive free layer 30 will always be saturated positively along the pinned axis in the operation range of the linear spin-valve sensor.

In the situation in which $H=H_b-H_{e1}$, $\sin\theta_1=1$ since sensing free layer 32,33 saturates in the negative direction ($\theta_1=-90°$). Therefore, the inequality preceding the last for interactive free layer 30 being saturated becomes $$H_b - H_{e1} + H_p - H_{k1}(-1) \geq H_{e2}$$

or $$H_b + H_p - (H_{e1} - H_{k1}) \geq H_{e2}.$$

Substituting the equation above for the bias point into this last equation allows it to be simplified to $$H_{in} \geq (H_{e1} - H_{k1}) + (H_{e2} - H_{k2}).$$

The terms $(H_{e1}-H_{k1}) \equiv H_{u1}$ and $(H_{e2}-H_{k2}) \equiv H_{u2}$ are the induced anisotropies of sensing free layer 32,33 and interactive free layer 30, respectively. Therefore, having interactive free layer 30 be saturated in the positive direction along the pinned axis requires that the sum of the induced anisotropies of both free layers should be less than the interlayer coupling $H_{in}$ between sensing free layer 32,33 and pinned layer 26. If $H_{in}$ is larger than 10 Oe, the above statement is always true if NiFe with a relatively small induced anisotropy is the ferromagnetic material chosen for fabricating both sensing free layer 32,33 and interactive free layer 30. Since the induced anisotropies $H_{u1}$ and $H_{u2}$ are process-dependent, this statement can also be true even for NiFeCo being the ferromagnetic material chosen for fabricating these free layers with its higher value induced anisotropy since the induced anisotropy with an easy axis along the resistor length can be reduced by processes such as annealing to meet the requirement.

The expression for the bias field obtained above, $H_b=H_{in}+H_{k2}-H_p$, shows that setting $H_p=H_{in}+H_{k2}$ is required to achieve a zero bias point That is, the demagnetization field $H_p$ from pinned layer 26 should equal the sum of the interlayer coupling $H_{in}$ (between pinned layer 26 and sensing free layer 30) and the shape anisotropy field $H_{k2}$ of interactive free layer 30.

The fractional resistance change of the sensor due to the giant magnetoresistive response effect resistance, or GMR%, at the bias point as a function of an externally applied magnetic field across the sensor width which is proportional to that field over the operating range of $-H_{e1}$ to $H_{e1}$ is $$\frac{\Delta R}{R} = GMR\% \; \frac{\sin\theta_1}{2} = GMR\% \; \frac{H}{2H_e}.$$

The sensitivity is the incremental resistance change in response to an incremental external applied magnetic field change, or $$\text{Sensitivity} = \partial((GMR\%)*\sin\theta_1/2)/\partial H = \frac{GMR\%}{2H_{e1}},$$

where, from above, $H_{e1}=H_{k1}+H_{u1}\cdot H_{k1}$ is the shape anisotropy of sensing free layer 32, 33. $H_{u1}$ is the induced anisotropy of sensing free layer 32, 33, which is process-dependent.

Considering now the alternative in which interactive free layer 30 remains unsaturated with an applied external field along the width of the sensor over the operating range of sensing free layer 32,33 so that $-90°<\theta_2<90°$ in the operation range of sensing free layer 32,33. As a result, $\sin\theta_2<1$.

Therefore, from the torque balance equation for interactive free layer 30 there is obtained $$\frac{H+H_p-H_{kl}\sin\theta_1}{H_{e2}}<1$$

or $$H+H_p-H_{k1}\sin\theta_1<H_{e2}$$

Substituting the torque balance equation for interactive free layer 30 into the torque balance equation for sensing free layer 32,33 to eliminate $\sin\theta_2$ yields)

$$(h_{e1}H_{e2}-H_{k1}H_{k2})\sin\theta_1-(H_{e2}-H_{k2})H+H_{in}H_{e2}+H_{k2}H_p-H_pH_{e2}=0$$

or $$H=\frac{H_{el}H_{e2}-H_{kl}H_{k2}}{H_{e2}-H_{k2}}\sin\theta_1+\frac{H_{in}H_{e2}+H_{k2}H_p-H_pH_{e2}}{H_{e2}-H_{k2}}.$$

Substituting this last equation into the preceding inequality provides $$\frac{H_{el}H_{e2}-H_{kl}H_{k2}}{(H_{e2}-H_{k2})H_{e2}}\sin\theta_1+\frac{H_{in}H_{e2}}{(H_{e2}-H_{k2})H_{e2}}<1$$

which can be simplified to $$(H_{e1}-H_{k1})\sin\theta_1+H_{in}<H_{e2}-H_{k2}.$$

If this last equation is satisfied at $\sin\theta_1=1$, then interactive free layer 30 remains unsaturated with an applied external field along the width of the sensor over the operating range of sensing free layer 32,33 of the linear spin-valve sensor. Thus, this last equation can be written $$(H_{e1}-H_{k1})+H_{in}<H_{e2}-H_{k2}.$$

From above, the terms $(H_{e1}-H_{k1})\equiv H_{u1}$ and $(H_{e2}-H_{k2})\equiv H_{u2}$ are the induced anisotropies of sensing free layer 32,33 and interactive free layer 30, respectively. Therefore, interactive free layer 30 remains unsaturated with an applied external field along the width of the sensor over the operating range of sensing free layer 32,33 if the sum of the induced anisotropy of sensing free layer 32,33 and the interlayer coupling $H_{in}$ between sensing free layer 32,33 and pinned layer 26 is smaller than the induced anisotropy of interactive free layer 30. This requires minimizing $H_{in}$ and making $(H_{e2}-H_{k2})=H_{u2}$ much larger than $(H_{e1}-H_{k1})=H_{u1}$.

Again, by assigning $\theta_1=0$ to represent the condition of an external bias magnetic field applied along the width of the sensor needed to keep the magnetization of sensing layer 30 oriented along the easy axis thereof parallel to the length of the sensor, where the sensor is most sensitive and linear, against the effects of the effective internal biasing fields, while maintaining the magnetic energy balance in the assumed situation in which $-90°<\theta_2<90°$, the bias point $H=H_b$ can be easily calculated from the preceding equation for H to be $$H_b=-H_p+H_{in}+\frac{H_{k2}}{H_{u2}}H_{in}$$

where $H_{u2}=H_{e2}-H_{k2}$ as given above. The condition for zero bias field can be found by setting $H_b=0$ as $$H_b=-H_p+H_{in}+\frac{H_{k2}}{H_{u2}}H_{in}=0$$

to give $$H_{in}=\frac{H_{u2}}{H_{u2}+H_{k2}}H_p.$$

Using the result given above from substituting the torque balance equation for interactive free layer 30 into the torque balance equation for sensing free layer 32,33, the fractional resistance change of the linear spin-valve resistor can be obtained as $$\frac{\Delta R}{R}=GMR\ \%\ *\sin\theta_1/2=\frac{GMR\ \%}{2}*\left(\frac{H_{e2}-H_{k2}}{B}H-\frac{C}{B}\right)$$

where $$B=H_{e1}H_{e2}-H_{k1}H_{k2}$$

and $$C=H_{in}H_{e2}-H_pH_{u2}$$

and further, R is the resistance at $\theta_1=0$ where the magnetization of sensing free layer 32,33 is aligned along the resistor length.

As above, the sensitivity of the linear spin-valve resistor in this situation can again be obtained by $$\text{Sensitivity}=\partial((GMR\ \%)*\sin\theta/2)/\partial H=\frac{GMR\ \%}{2}*\frac{H_{e2}-H_{k2}}{B}.$$

A more general situation occurs if the sensing free layer is neither always saturated along the pinned axis nor has its magnetization oriented such that $-90°<\theta_2<90°$ insofar as reorientations of the magnetizations of both sensing free layer 32, 33 and interactive free layer 30 in the operating range of the sensing layer. If the same ferromagnetic material is chosen for both sensing free layer 32,33 and interactive free layer 30, the magnetization of interactive free layer 30 will always saturate in a smaller magnetic field in the positive field direction than the field magnitude needed to saturate the sensing free layer.

In principle, linear spin-valve sensors can be designed to achieve and operate either with interactive layer 30 saturated along the pinned axis or with its magnetization oriented such that $-90°<\theta_2<90°$ or in some other condition. In the following, data is presented for spin-valve sensor magnetoresistors working with interactive layer 30 saturated along the pinned axis. In this mode, the spin-valve resistors with two free layers have the advantages of reduced hysteresis and easy bias point adjustment through varyinging the thickness of the interactive free layer without, sacrificing the sensor sensitivity to external magnetic fields.

Figure 7A:
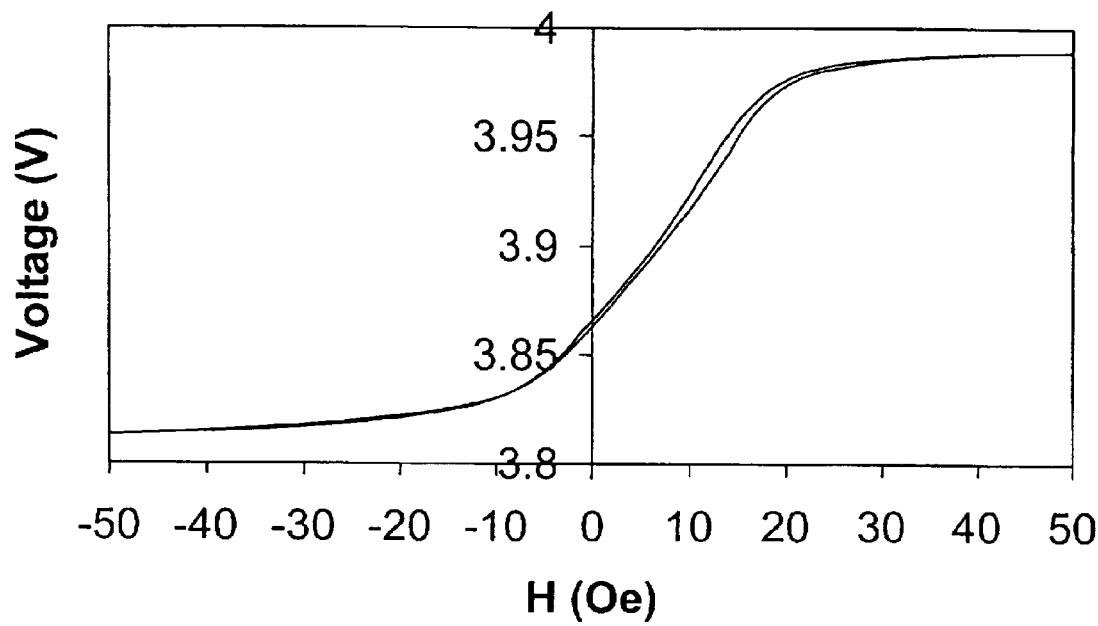
FIGS. 7A and 7B is a voltage versus magnetic field (along the pinned layer magnetization direction) plot for a spin valve with a two free layers and a single free layer, respectively.
Figure 7B:
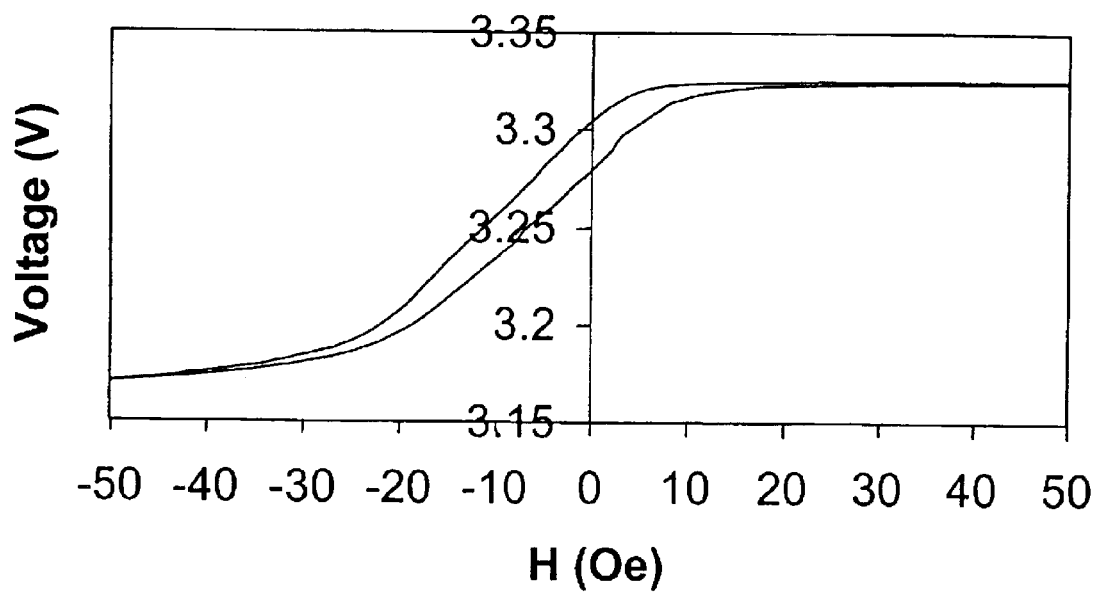

Sheet spin-valve stacks were deposited applying a field during deposition so that the easy axes of the free layers and the easy axis of the pinned layer are perpendicular to each other. Then the sheet spin-valves stacks were patterned into magnetoresistors with the easy axis of the pinned layer oriented in the transverse direction across the width. Shown in FIGS. 7A and 7B are the transfer curves of 4 μm wide crenelated pattern magnetoresistors provided with two free layers in the first instance and a single free layer in the latter instance. Linear spin-valve magnetoresistors with double free layers are seen to exhibit much lower hysteresis.

The reduction of the hysteresis could possibly be due to two reasons. The first one is the reduction of the fringe field effects on the sensing free layer since the pinned layer and interactive free layer are aligned antiparallel. The second one is an interactive free layer used in a crenelated pattern GMR sensor can stabilize the sensor and serve a unique purpose in that it inhibits hysteresis producing domain walls from forming near the ends of the sensors in a crenelated pattern layout. By a combination of deposition and anneal steps, the hysteresis of sensors with two free layers can even be reduced to a degree that no noticeable hysteresis can be observed.

Figure 8A:
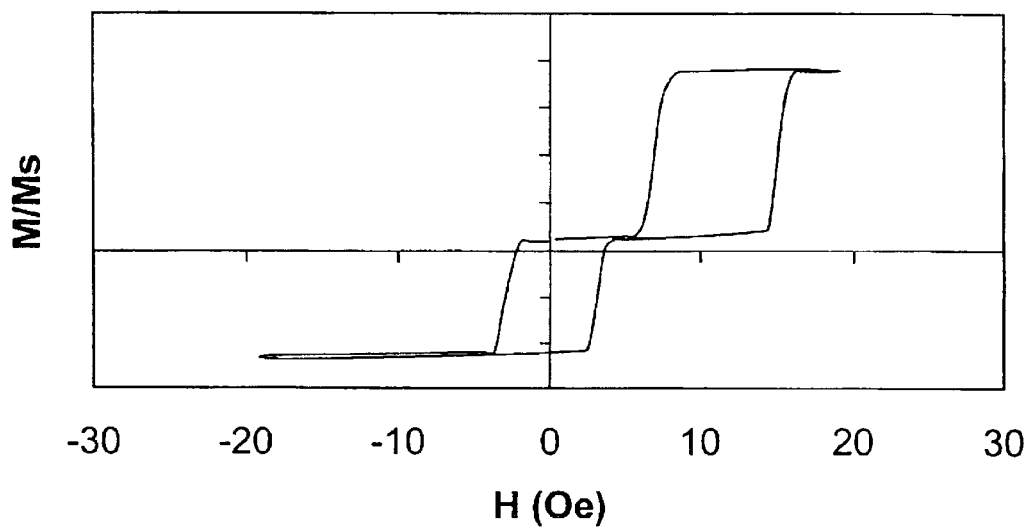
FIGS. 8A and 8B are magnetization and voltage plots, respectively, versus applied magnetic field along the pinned layer magnetization direction.
Figure 8B:
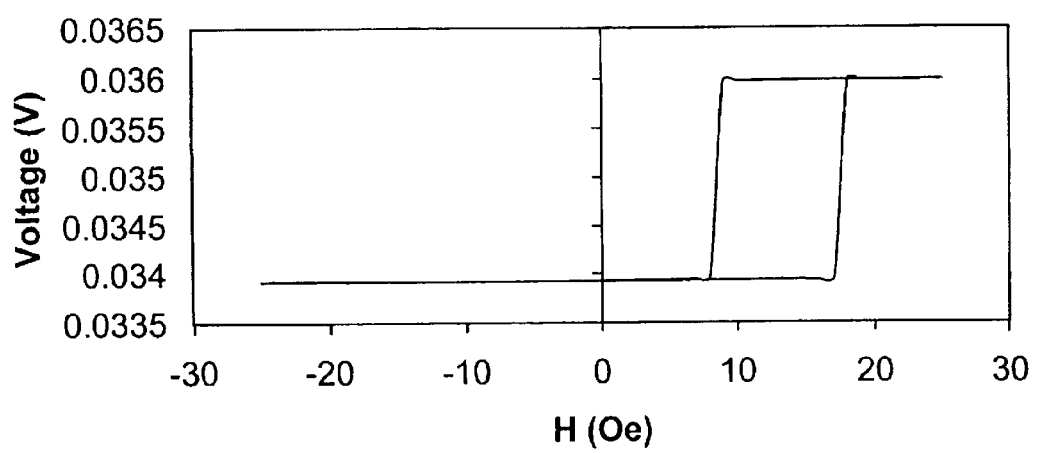

FIG. 8A is the M-H curve of the sheet spin-valve stack with two free layers, where two loops in the curve represent respectively the magnetization reversal of the top and bottom free layers. Note, in this case, the magnetization of all the magnetic layers are parallel as achieved by applying a field during deposition and anneal. FIG. 8B shows the corresponding MR curve, the only loop reflects the magnetization reversal of the sensing free layer which contributes to the GMR.

The spin-valve crenelated pattern magnetoresistors were fabricated by photolithographically patterning and then reorienting the pinning axis (of the pinned layer) into the transverse direction of the magnetoresistors. The fabricated linear spin-valve sensing resistors exhibit excellent linearity with no visible hysteresis. The linearity error is less than 0.05%.

Figure 9:
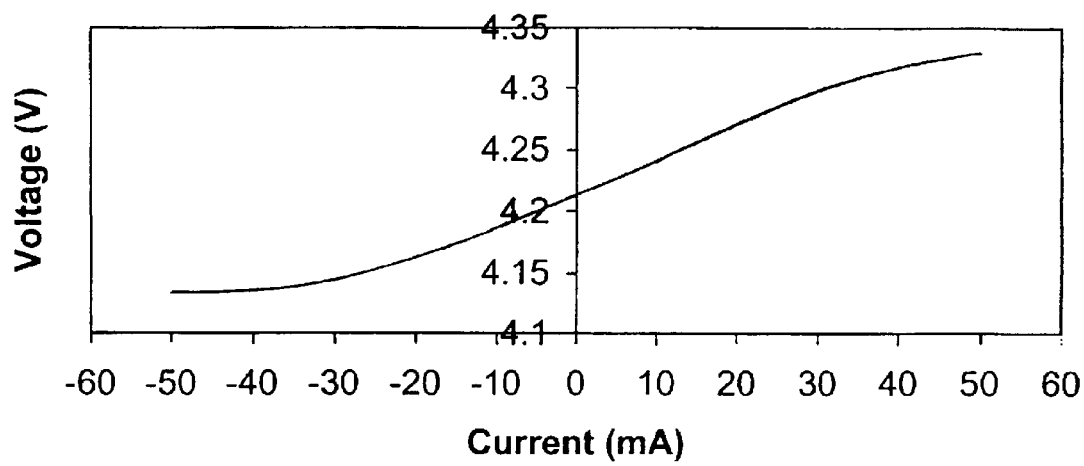
FIG. 9 is a voltage versus applied field along the pinned layer magnetization direction for a fully processed magnetoresistive isolator device.

FIG. 9 shows a 4 μm wide crenelated pattern resistor response to sweeping a current through an on-chip coil in a fully processed isolated current sensor (or analog isolator), where the magnetoresistor is electrically separated from the on-chip coil by a 11 μm wide BCB isolation layer. The coil efficiency is measured to be ~0.8 Oe/mA. Note the coil efficiency is the ratio of the magnetic field generated on the spin-valve sensing element to the current passing through the coil. The response represents a full sweep showing a negligible hysteresis.

The bias point is the middle point of the GMR transfer curve. By employing spin-valve magnetoresistors with two free layers, the bias point can be adjusted by varying the thickness of the interacting layer. Table I shows magnetic properties of sheet spin-valve stacks with different interacting layer thickness.

TABLE I

| Wafer # | Hc Oe | Hcoup Oe | Sheet Rho Ω | GMR % | Ta40-NiFe(X)-Ta50-NiFe30-CoFe10-Cu26.5-CoFe40-CrPtMn325-Ta40 |
|---|---|---|---|---|---|
| 213 | 5.2 | 8.4 | 16.4 | 7.25 | X = 0 Å |
| 282 | 4.5 | 7.8 | 15.3 | 6.76 | X = 40 Å |
| 270 | 3.9 | 7.4 | 13.2 | 5.9 | X = 80 Å |

Figure 10:
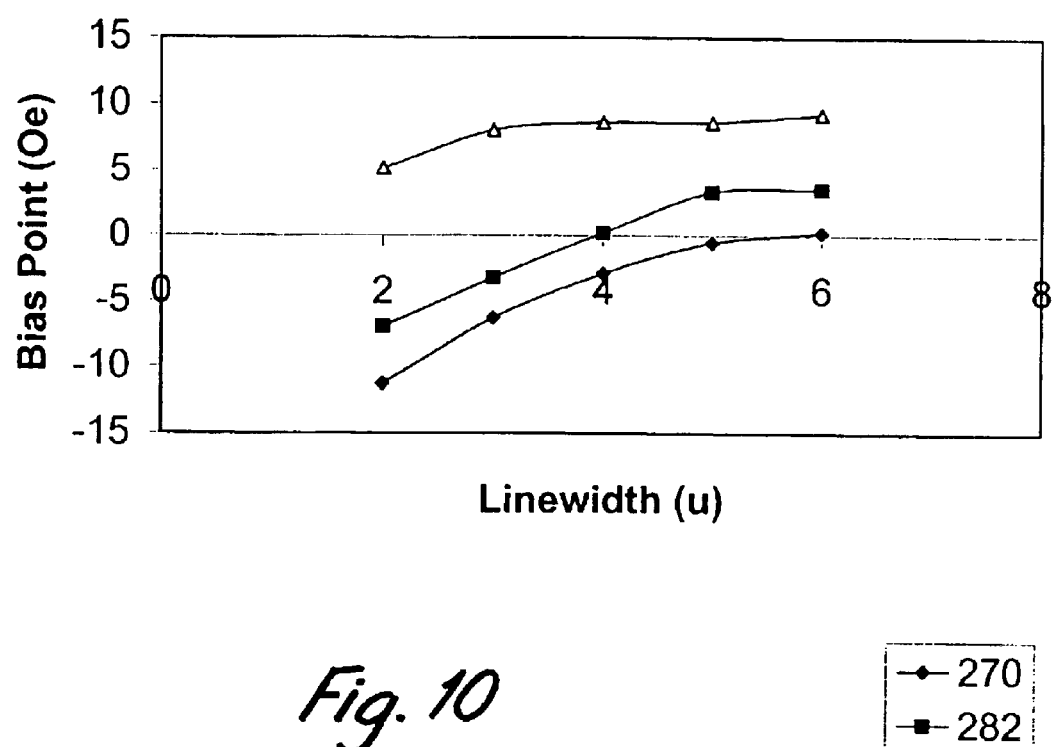
FIG. 10 is a plot of Bias Field (Oersted) versus width (microns) for three different wafers each having a different interactive free layer thickness for the devices therein.

FIG. 10 shows the dependence of the bias field on the magnetoresistor width. Curves 213, 282 and 270 are the data acquired from spin-valve magnetoresistors with different thickness of interacting layer of 0 Å, 40 Å and 80 Å respectively. Generally, with a fixed thickness of the interacting layer, with a decrease of the width, the bias point is pushed toward (or into) the negative field side. However, with a fixed magnetoresistor width, with an increase of the thickness of the interacting layer, the bias point is pushed toward (or into ) the positive side. Since the above spin-valve structure with two free layers has its interactive free layer saturated, the interactive free layer easy axis is actually aligned in the transverse direction, and is antiparallel to the pinned layer easy axis. In this mode, the interactive layer not only can reduce the fringe field effect on the sensing free layer which contributes to the GMR but also has an effect to move the bias field toward positive side against the fringe field from the pinned layer, which pushing the bias point toward (or into) the negative side.

Figure 6:
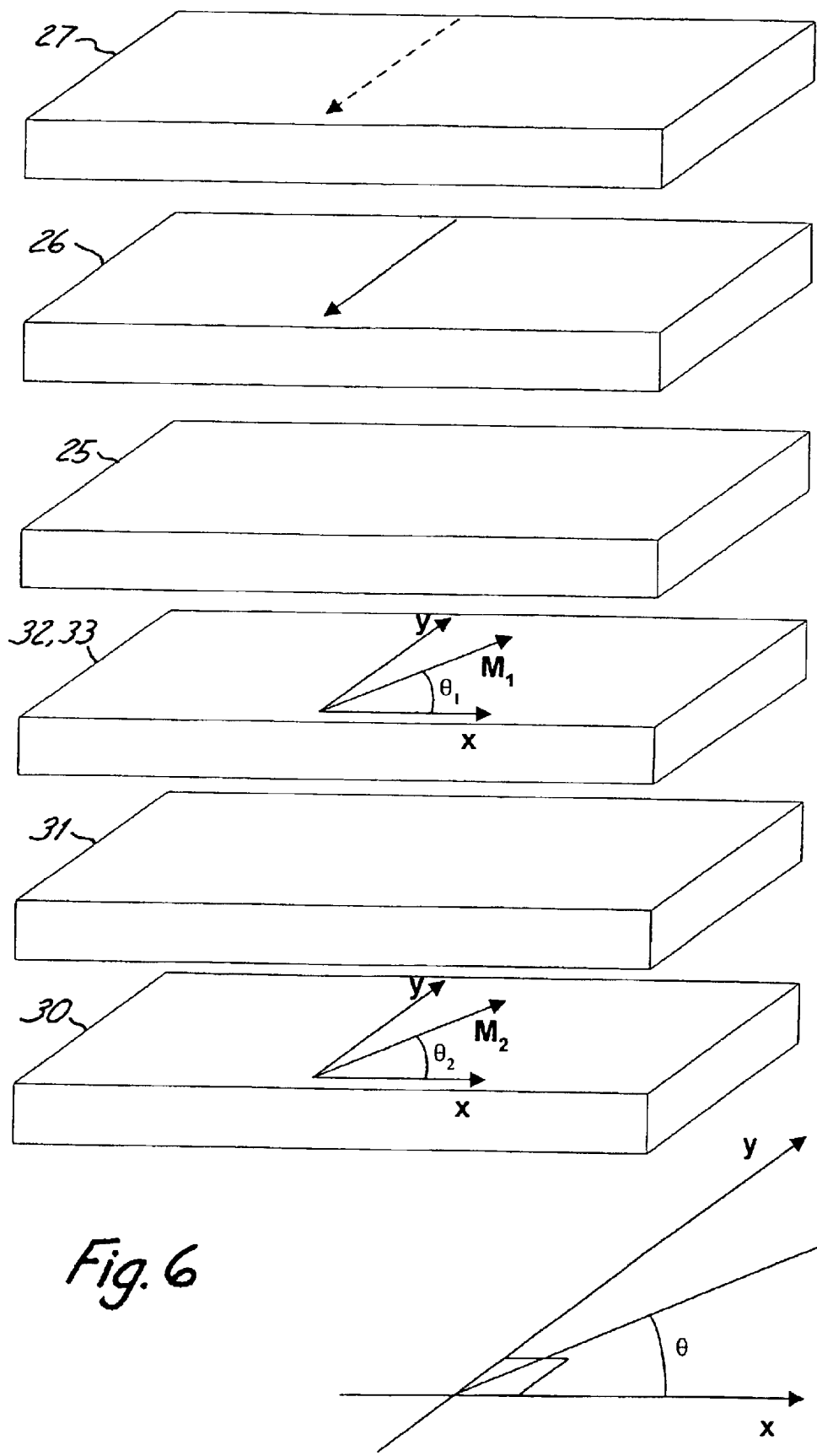
FIG. 6 is a perspective view schematic defining the coordinates for the inventive magnetoresistive structures and the magnetization orientations therein.
Figure 11:
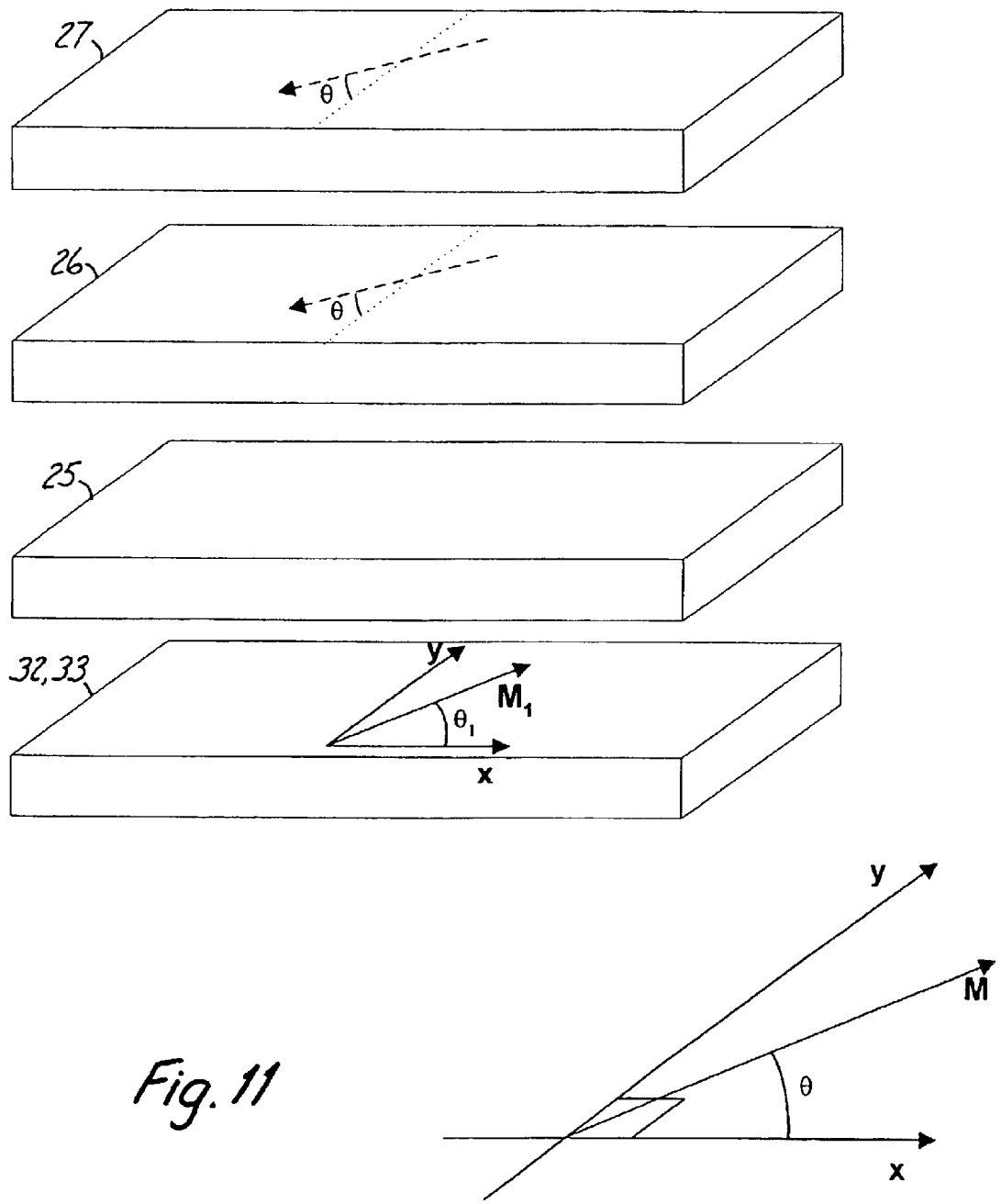
FIG. 11 is a perspective view schematic showing slightly skewed pinning layer and pinned layer easy axes of a sensor portion.

FIG. 11 is a perspective view schematic model of a portion of FIG. 6 showing a slightly skewed pinning direction in pinning layer 27 and pinned layer 26. This skew provides a bias field to sensing free layer 32,33 to further reduce hysteresis.

Figure 12:
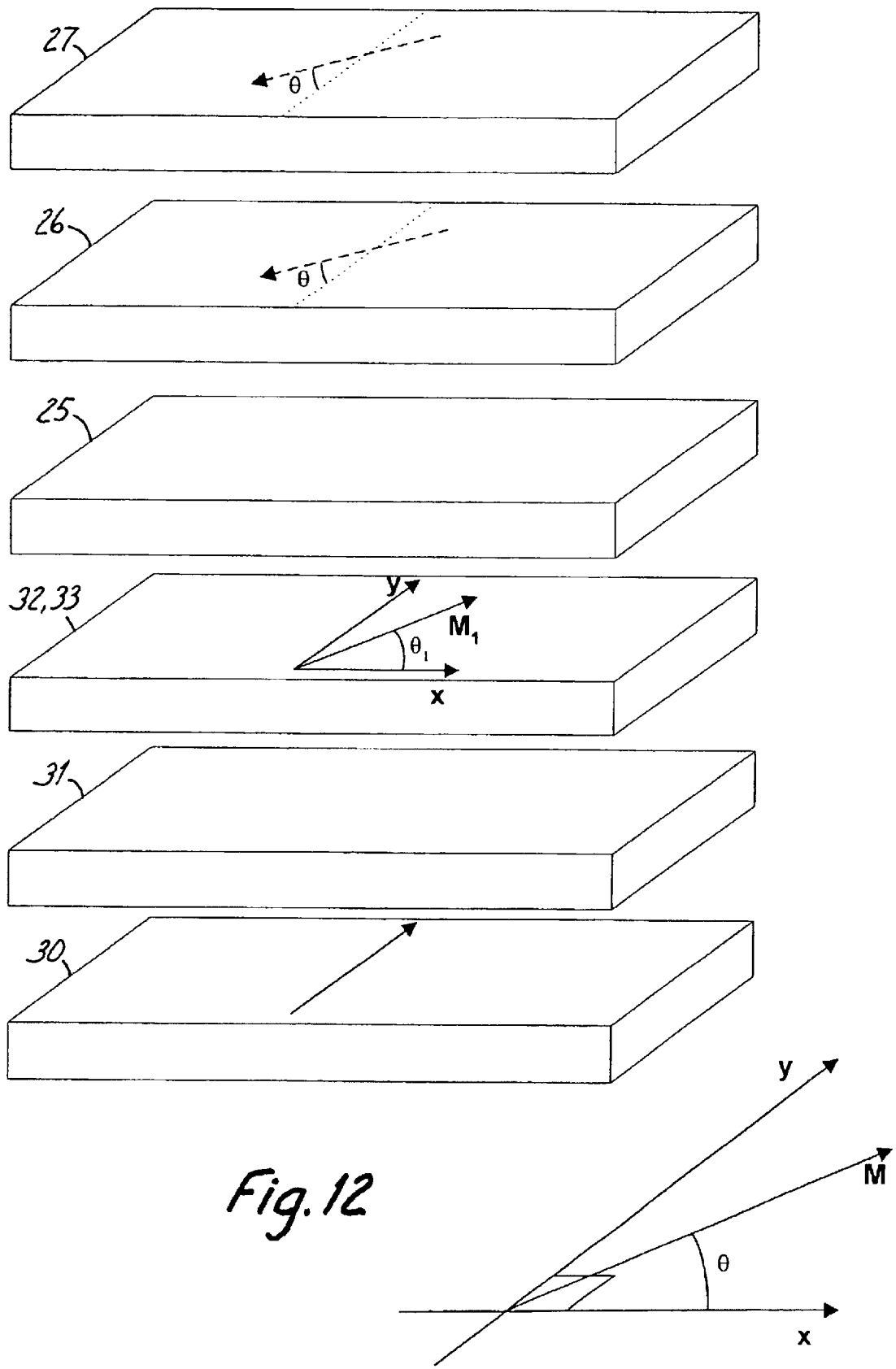
FIG. 12 shows a perspective view schematic of a sensor where the bottom free layer magnetization is always saturated in the positive direction.

FIG. 12 is a perspective view schematic model of FIG. 6 in which interactive layer 30 is saturated along the pinned axis in the positive direction.

Although the present invention has been described with reference to preferred embodiments, workers skilled in the art will recognize that changes may be made in form and detail without departing from the spirit and scope of the invention.

What is claimed is:

1. A ferromagnetic thin-film based magnetic field sensor, said sensor comprising:
   a substrate; and
   a sensing structure supported on said substrate comprising:
   a nonmagnetic intermediate layer, said nonmagnetic intermediate layer having two major surfaces on opposite sides thereof;
   a magnetization reference layer on one of said nonmagnetic intermediate layer major surfaces having a relatively fixed magnetization direction;
   a sensing film of an anisotropic ferromagnetic material on that remaining one of said nonmagnetic intermediate layer major surfaces and characterized by an induced anisotropy field, said sensing film being magnetically coupled to said magnetization reference layer characterized by an interlayer coupling field;
   a spacer layer on said sensing film and across said sensing film from one of said nonmagnetic intermediate layer major surfaces, said spacer layer having a major surface on a side thereof opposite said sensing film; and
   an augmenting film of an anisotropic ferromagnetic material on said spacer layer major surface characterized by an induced anisotropy field with said augmenting film induced anisotropy field and said sensing film induced anisotropy field summing to less than said interlayer coupling field.

2. The apparatus of claim 1 wherein said magnetization reference layer comprises an anisotropic ferromagnetic material.

3. The apparatus of claim 1 wherein said magnetization reference layer is a first magnetization reference layer, and further comprising a second magnetization reference layer provided on that same one of said nonmagnetic intermediate layer major surfaces as said first magnetization reference layer, and also having a relatively fixed magnetization direction.

4. The apparatus of claim 1 wherein said sensing film and said augmenting film together have a length along a selected direction and a width substantially perpendicular thereto that is smaller in extent than said length and together have a shaped end portion extending over a portion of said length in which said width gradually reduces to zero at that end thereof.

5. The apparatus of claim 1 wherein a said nonmagnetic intermediate layer is an electrically conducting layer.

6. The apparatus of claim 1 wherein a said nonmagnetic intermediate layer is an electrically insulative layer.

7. The apparatus of claim 1 wherein a said substrate comprises a monolithic integrated circuit.

8. The apparatus of claim 2 wherein said magnetization reference layer is a composite layer and, in addition to said ferromagnetic material layer therein, further comprises an antiferromagnetic material layer therein.

9. The apparatus of claim 1 wherein said sensing film and said augmenting film together have a length along a selected direction and a width substantially perpendicular thereto that is smaller in extent than said length, and said magnetization reference layer has said relatively fixed magnetization direction thereof along said width.

10. The apparatus of claim 5 wherein a said spacer layer is of tantalum.

11. The apparatus of claim 1 wherein said sensing film and said augmenting film together have a length along a selected direction and a width substantially perpendicular thereto that is smaller in extent than said length, and said selected direction and said relatively fixed magnetization direction are skewed from said width direction.

12. The apparatus of claim 1 wherein said augmenting film has a thickness selected to substantially eliminate bias in the magnetoresistance versus externally applied magnetic field relationship of said sensing film with respect to said externally applied magnetic field.

13. The apparatus of claim 6 wherein a said spacer layer is of tantalum.

14. A ferromagnetic thin-film based magnetic field sensor, said sensor comprising:
   a substrate; and
   a sensing structure supported on said substrate comprising:
      a nonmagnetic intermediate layer, said nonmagnetic intermediate layer having two major surfaces on opposite sides thereof;
      a magnetization reference layer on one of said nonmagnetic intermediate layer major surfaces having a relatively fixed magnetization direction;
      a sensing film of an anisotropic ferromagnetic material on that remaining one of said nonmagnetic intermediate layer major surfaces and characterized by an induced anisotropy field, said sensing film being magnetically coupled to said magnetization reference layer characterized by an interlayer coupling field;
      a spacer layer on said sensing film and across said sensing film from one of said nonmagnetic intermediate layer major surfaces, said spacer layer having a major surface on a side thereof opposite said sensing film; and
      an augmenting film of an anisotropic ferromagnetic material on said spacer layer major surface characterized by an induced anisotropy field with said augmenting film induced anisotropy field exceeding said sensing film induced anisotropy field summing with said interlayer coupling field.

15. The apparatus of claim 14 wherein said magnetization reference layer comprises an anisotropic ferromagnetic material.

16. The apparatus of claim 14 wherein said magnetization reference layer is a first magnetization reference layer, and further comprising a second magnetization reference layer provided on that same one of said nonmagnetic intermediate layer major surfaces as said first magnetization reference layer, and also having a relatively fixed magnetization direction.

17. The apparatus of claim 14 wherein said sensing film and said augmenting film together have a length along a selected direction and a width substantially perpendicular thereto that is smaller in extent than said length and together have a shaped end portion extending over a portion of said length in which said width gradually reduces to zero at that end thereof.

18. The apparatus of claim 14 wherein a said nonmagnetic intermediate layer is an electrically conducting layer.

19. The apparatus of claim 14 wherein a said nonmagnetic intermediate layer is an electrically insulative layer.

20. The apparatus of claim 14 wherein a said substrate comprises a monolithic integrated circuit.

21. The apparatus of claim 14 wherein said sensing film and said augmenting film together have a length along a selected direction and a width substantially perpendicular thereto that is smaller in extent than said length, and said magnetization reference layer has said relatively fixed magnetization direction thereof along said width.

22. The apparatus of claim 14 wherein said sensing film and said augmenting film together have a length along a selected direction and a width substantially perpendicular thereto that is smaller in extent than said length, and said selected direction and said relatively fixed magnetization direction are skewed from said width direction.

23. The apparatus of claim 14 wherein said augmenting film has a thickness selected to substantially eliminate bias in the magnetoresistance versus externally applied magnetic field relationship of said sensing film with respect to said externally applied magnetic field.

24. The apparatus of claim 18 wherein a said spacer layer is of tantalum.

25. The apparatus of claim 19 wherein a said spacer layer is of tantalum.

26. A ferromagnetic thin-film based magnetic field sensor, said sensor comprising:
   a substrate; and
   a sensing structure supported on said substrate comprising:
      a nonmagnetic intermediate layer, said nonmagnetic intermediate layer having two major surfaces on opposite sides thereof;
      a magnetization reference layer on one of said nonmagnetic intermediate layer major surfaces having a relatively fixed magnetization direction;
      a sensing film of an anisotropic ferromagnetic material on that remaining one of said nonmagnetic intermediate layer major;
      a spacer layer on said sensing film and across said sensing film from one of said nonmagnetic intermediate layer major surfaces, said spacer layer having a major surface on a side thereof opposite said sensing film; and
      an augmenting film of an anisotropic ferromagnetic material on said spacer layer major surface, said sensing film and said augmenting film together have a length parallel to said spacer layer major surface that is along a selected direction and a width parallel to said spacer layer major surface that is substantially perpendicular thereto that is smaller in extent than said length, and said selected direction and said relatively fixed magnetization direction are skewed from said length and width directions.

27. The apparatus of claim 26 wherein said magnetization reference layer comprises an anisotropic ferromagnetic material.

28. The apparatus of claim 26 wherein said magnetization reference layer is a first magnetization reference layer, and further comprising a second magnetization reference layer provided on that same one of said nonmagnetic intermediate layer major surfaces as said first magnetization reference layer, and also having a relatively fixed magnetization direction.

29. The apparatus of claim 26 wherein said sensing film and said augmenting film together have a length along a selected direction and a width substantially perpendicular thereto that is smaller in extent than said length and together have a shaped end portion extending over a portion of said length in which said width gradually reduces to zero at that end thereof.

30. The apparatus of claim 26 wherein a said nonmagnetic intermediate layer is an electrically conducting layer.

31. The apparatus of claim 26 wherein a said nonmagnetic intermediate layer is an electrically insulative layer.

32. The apparatus of claim 26 wherein a said substrate comprises a monolithic integrated circuit.

33. The apparatus of claim 30 wherein a said spacer layer is of tantalum.

34. The apparatus of claim 31 wherein a said spacer layer is of tantalum.

* * * * *

UNITED STATES PATENT AND TRADEMARK OFFICE
CERTIFICATE OF CORRECTION

PATENT NO. : 6,872,467 B2  Page 1 of 1
APPLICATION NO. : 10/704870
DATED : March 29, 2005
INVENTOR(S) : Zhenghong Qian It is certified that error appears in the above-identified patent and that said Letters Patent is hereby corrected as shown below:

Column 1, Line 12, insert the following paragraph between Cross-Reference To Related Application paragraph and Background of the Invention:

--This invention was made with Government support under Contract Number F29601-0s-C-0278 awarded by the Air Force Research Lab. The Government has certain rights in the invention.--

Signed and Sealed this

Twenty-second Day of July, 2008

JON W. DUDAS
*Director of the United States Patent and Trademark Office*